US009500673B2

(12) United States Patent
Erdman et al.

(10) Patent No.: US 9,500,673 B2
(45) Date of Patent: *Nov. 22, 2016

(54) ELECTRICALLY CONDUCTIVE KELVIN CONTACTS FOR MICROCIRCUIT TESTER

(71) Applicant: Johnstech International Corporation, Minneapolis, MN (US)

(72) Inventors: Joel Erdman, Waconla, MN (US); Jeffrey Sherry, Savage, MN (US); Gary Michalko, Ham Lake, MN (US)

(73) Assignee: Johnstech International Corporation, Minneapolis, MN (US)

( * ) Notice: Subject to any disclaimer, the term of this patent is extended or adjusted under 35 U.S.C. 154(b) by 207 days.

This patent is subject to a terminal disclaimer.

(21) Appl. No.: 14/053,794

(22) Filed: Oct. 15, 2013

(65) Prior Publication Data

US 2014/0103949 A1 Apr. 17, 2014

Related U.S. Application Data

(63) Continuation of application No. 12/764,603, filed on Apr. 21, 2010, now Pat. No. 8,558,554.

(60) Provisional application No. 61/171,141, filed on Apr. 21, 2009, provisional application No. 61/257,236, filed on Nov. 2, 2009, provisional application No. 61/307,501, filed on Feb. 24, 2010.

(51) Int. Cl.
*G01R 1/067* (2006.01)
*G01R 1/04* (2006.01)
*G01R 1/073* (2006.01)

(52) U.S. Cl.
CPC ............. *G01R 1/067* (2013.01); *G01R 1/0466* (2013.01); *G01R 1/07378* (2013.01)

(58) Field of Classification Search
None
See application file for complete search history.

(56) References Cited

U.S. PATENT DOCUMENTS

| 4,308,498 A | 12/1981 | Madajewski et al. |
|---|---|---|
| 6,069,480 A | 5/2000 | Sabounchi et al. |
| 6,888,362 B2 | 5/2005 | Eldridge et al. |

(Continued)

FOREIGN PATENT DOCUMENTS

| CN | 101067642 | 11/2007 |
|---|---|---|
| JP | H04-051675 U1 | 4/1992 |
| WO | WO 2008/083404 | 7/2008 |

OTHER PUBLICATIONS

International Search Report PCT/10/31896, Jun. 23, 2010.
(Continued)

*Primary Examiner* — Paresh Patel
(74) *Attorney, Agent, or Firm* — Altera Law Group, LLC

(57) ABSTRACT

Terminals of a device under test are connected to corresponding contact pads or leads by a series of electrically conductive contacts. Each terminal testing connects with both a "force" contact and a "sense" contact. In one embodiment, the sense contact partially or completely laterally surrounds the force contact, so that it need not have its own resiliency. The sense contact has a forked end with prongs that extend to opposite sides of the force contact. Alternatively, the sense contact surrounds the force contact and slides laterally to match a lateral translation component of a lateral cross-section of the force contact during longitudinal compression of the force contact. Alternatively, the sense contact includes rods that have ends on opposite sides of the force contact, and extend parallel.

17 Claims, 25 Drawing Sheets

(56) References Cited

U.S. PATENT DOCUMENTS

| | | |
|---|---|---|
| 7,218,127 B2 | 5/2007 | Cooper et al. |
| 7,255,576 B2 | 8/2007 | O'Sullivan et al. |
| 2002/0149388 A1 | 10/2002 | Messick |
| 2007/0023823 A1 | 2/2007 | Lee et al. |
| 2007/0236236 A1 | 10/2007 | Shell et al. |
| 2008/0218191 A1 | 9/2008 | Kimoto et al. |

OTHER PUBLICATIONS

Japanese Office Action dated Oct. 8, 2013 for Japanese application No. 2012-507350.

English translation of Chinese Office Action for pending Chinese application No. 201080027549.x dated Nov. 27, 2013.

English translation of Korean Office Action for pending Korean application No. 10-2011-7027706 dated Oct. 24, 2013.

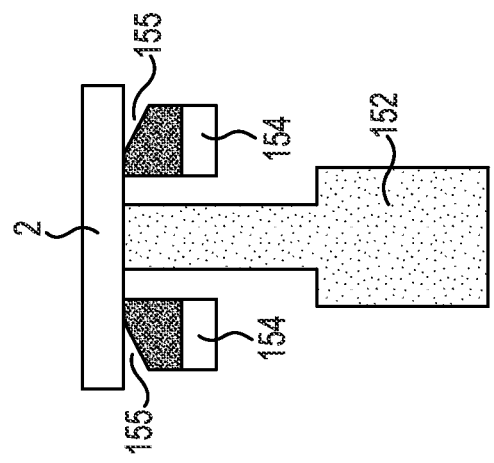

ELECTRICALLY CONDUCTIVE KELVIN CONTACTS FOR MICROCIRCUIT TESTER

CROSS-REFERENCE TO RELATED APPLICATIONS

This application is a continuation of application Ser. No. 12/764,603 filed on 21 Apr. 2010 which claims priority of provisional application No. 61/171,141, filed on 21 Apr. 2009, provisional application No. 61/257,236, filed on 2 Nov. 2009, and provisional application No. 61/307,501, filed on 24 Feb. 2010, which hereby is incorporated herein by reference in its entirety.

STATEMENT REGARDING FEDERALLY SPONSORED RESEARCH OR DEVELOPMENT

Not Applicable

BACKGROUND OF THE INVENTION

Field of the Invention

The present invention is directed to equipment for testing microcircuits.

Description of the Related Art

As microcircuits continually evolve to be smaller and more complex, the test equipment that tests the microcircuits also evolves. There is an ongoing effort to improve microcircuit test equipment, with improvements leading to an increase in reliability, an increase in throughput, and/or a decrease in expense.

Mounting a defective microcircuit on a circuit board is relatively costly. Installation usually involves soldering the microcircuit onto the circuit board. Once mounted on a circuit board, removing a microcircuit is problematic because the very act of melting the solder for a second time ruins the circuit board. Thus, if the microcircuit is defective, the circuit board itself is probably ruined as well, meaning that the entire value added to the circuit board at that point is lost. For all these reasons, a microcircuit is usually tested before installation on a circuit board.

Each microcircuit must be tested in a way that identifies all defective devices, but yet does not improperly identify good devices as defective. Either kind of error, if frequent, adds substantial overall cost to the circuit board manufacturing process, and can add retest costs for devices improperly identified as defective devices.

Microcircuit test equipment itself is quite complex. First of all, the test equipment must make accurate and low resistance temporary and non-destructive electrical contact with each of the closely spaced microcircuit contacts. Because of the small size of microcircuit contacts and the spacings between them, even small errors in making the contact will result in incorrect connections. Connections to the microcircuit that are misaligned or otherwise incorrect will cause the test equipment to identify the device under test (DUT) as defective, even though the reason for the failure is the defective electrical connection between the test equipment and the DUT rather than defects in the DUT itself.

A further problem in microcircuit test equipment arises in automated testing. Testing equipment may test 100 devices a minute, or even more. The sheer number of tests cause wear on the tester contacts making electrical connections to the microcircuit terminals during testing. This wear dislodges conductive debris from both the tester contacts and the DUT terminals that contaminates the testing equipment and the DUTs themselves.

The debris eventually results in poor electrical connections during testing and false indications that the DUT is defective. The debris adhering to the microcircuits may result in faulty assembly unless the debris is removed from the microcircuits. Removing debris adds cost and introduces another source of defects in the microcircuits themselves.

Other considerations exist as well. Inexpensive tester contacts that perform well are advantageous. Minimizing the time required to replace them is also desirable, since test equipment is expensive. If the test equipment is off line for extended periods of normal maintenance, the cost of testing an individual microcircuit increases.

Test equipment in current use has an array of test contacts that mimic the pattern of the microcircuit terminal array. The array of test contacts is supported in a structure that precisely maintains the alignment of the contacts relative to each other. An alignment plate or board aligns the microcircuit itself with the test contacts. Many times the alignment plate is separate from the housing that houses the contacts because it tends to wear and need replacing more often. The test housing and the alignment plate are mounted on a load board having conductive pads that make electrical connection to the test contacts. The load board pads are connected to circuit paths that carry the signals and power between the test equipment electronics and the test contacts.

For the electrical tests, it is desired to form a temporary electrical connection between each terminal on the device under test and a corresponding electrical pad on a load board. In general, it is impractical to solder and remove each electrical terminal on the microcircuit being contacted by a corresponding electrical probe on the testbed. Instead of soldering and removing each terminal, the tester may employ a series of electrically conductive contacts arranged in a pattern that corresponds to both the terminals on the device under test and the electrical pads on the load board. When the device under test is forced into contact with the tester, the contacts complete the circuits between respective device under test contacts and corresponding load board pads. After testing, when the device under test is released, the terminals separate from the contacts and the circuits are broken.

The present application is directed to improvements to these contacts.

There is a type of testing known as "Kelvin" testing, which accurately measures the resistance between two terminals on the device under test. Basically, Kelvin testing involves forcing a current to flow between the two terminals, measuring the voltage difference between the two terminals, and using Ohm's Law to derive the resistance between the terminals, given as the voltage divided by the current. Each terminal on the device under test is electrically connected to two contacts and their associated pads on the load board. One of the two pads supplies a known amount of current. The other pad, known as the "sense" connection, is a high-impedance connection that acts as a voltmeter, which does not draw any significant amount of current. In other words, each terminal on the device under test that is to undergo Kelvin testing is simultaneously electrically connected to two pads on the load board—one pad supplying a known amount of current and the other pad measuring a voltage and drawing an insignificant amount of current while doing so. The terminals are Kelvin tested two at a time, so that a single resistance measurement uses two terminals on the load board and four contact pads.

In this application, the contacts that form the temporary electrical connections between the device under test and the load board may be used in several manners. In a "standard"

test, each contact connects a particular terminal on the device under test to a particular pad on the load board, with the terminals and pads being in a one-to-one relationship. For these standard tests, each terminal corresponds to exactly one pad, and each pad corresponds to exactly one terminal. In a "Kelvin" test, there are two contacts contacting each terminal on the device under test, as described above. For these Kelvin tests, each terminal on the device under test corresponds to two pads on the load board, and each pad on the load board corresponds to exactly one terminal on the device under test. Although the testing scheme may vary, the mechanical structure and use of the contacts is essentially the same, regardless of the testing scheme.

There are many aspects of the testbeds that may be incorporated from older or existing testbeds. For instance, much of the mechanical infrastructure and electrical circuitry may be used from existing test systems, and may be compatible with the electrically conductive contacts disclosed herein. Such existing systems are listed and summarized below.

An exemplary microcircuit tester is disclosed in United States Patent Application Publication Number US 2007/0202714 A1, titled "Test contact system for testing integrated circuits with packages having an array of signal and power contacts", invented by Jeffrey C. Sherry, published on Aug. 30, 2007 and incorporated by reference herein in its entirety.

For the tester of '714, a series of microcircuits is tested sequentially, with each microcircuit, or "device under test", being attached to a testbed, tested electrically, and then removed from the testbed. The mechanical and electrical aspects of such a testbed are generally automated, so that the throughput of the testbed may be kept as high as possible.

In '714, a test contact element for making temporary electrical contact with a microcircuit terminal comprises at least one resilient finger projecting from an insulating contact membrane as a cantilevered beam. The finger has on a contact side thereof, a conducting contact pad for contacting the microcircuit terminal. Preferably the test contact element has a plurality of fingers, which may advantageously have a pie-shaped arrangement. In such an arrangement, each finger is defined at least in part by two radially oriented slots in the membrane that mechanically separate each finger from every other finger of the plurality of fingers forming the test contact element.

In '714, a plurality of the test contact elements can form a test contact element array comprising the test contact elements arranged in a predetermined pattern. A plurality of connection vias are arranged in substantially the predetermined pattern of the test contacts elements, with each of said connection vias is aligned with one of the test contact elements. Preferably, an interface membrane supports the plurality of connection vias in the predetermined pattern. Numerous vias can be embedded into the pie pieces away from the device contact area to increase life. Slots separating fingers could be plated to create an I-beam, thereby preventing fingers from deforming, and also increasing life.

The connection vias of '714 may have a cup shape with an open end, with the open end of the cup-shaped via contacting the aligned test contact element. Debris resulting from loading and unloading DUTs from the test equipment can fall through the test contact elements where the cup-shaped vias impound the debris.

The contact and interface membranes of '714 may be used as part of a test receptacle including a load board. The load board has a plurality of connection pads in substantially the predetermined pattern of the test contacts elements. The load board supports the interface membrane with each of the connection pads on the load board substantially aligned with one of the connection vias and in electrical contact therewith.

In '714, the device uses a very thin conductive plate with retention properties that adheres to a very thin non-conductive insulator. The metal portion of the device provides multiple contact points or paths between the contacting I/O and the load board. This can be done either with a plated via hole housing or with plated through hole vias, or bumped surfaces, possibly in combination with springs, that has the first surface making contact with the second surface, i.e., the device I/O. The device I/O may be physically close to the load board, thus improving electrical performance.

One particular type of microcircuit often tested before installation has a package or housing having what is commonly referred to as a ball grid array (BGA) terminal arrangement. A typical BGA package may have the form of a flat rectangular block, with typical sizes ranging from 5 mm to 40 mm on a side and 1 mm thick.

A typical microcircuit has a housing enclosing the actual circuitry. Signal and power (S&P) terminals are on one of the two larger, flat surfaces, of the housing. Typically, terminals occupy most of the area between the surface edges and any spacer or spacers. Note that in some cases, a spacer may be an encapsulated chip or a ground pad.

Each of the terminals may include a small, approximately spherical solder ball that firmly adheres to a lead from the internal circuitry penetrating surface, hence the term "ball grid array." Each terminal and spacer project a small distance away from the surface, with the terminals projecting farther from the surface than the spacers. During assembly, all terminals are simultaneously melted, and adhere to suitably located conductors previously formed on the circuit board.

The terminals themselves may be quite close to each other. Some have centerline spacings of as little as 0.25 mm, and even relatively widely spaced terminals may still be around 1.5 mm apart. Spacing between adjacent terminals is often referred to as "pitch."

In addition to the factors mentioned above, BGA microcircuit testing involves additional factors.

First, in making the temporary contact with the ball terminals, the tester should not damage the S&P terminal surfaces that contact the circuit board, since such damage may affect the reliability of the solder joint for that terminal.

Second, the testing process is more accurate if the length of the conductors carrying the signals is kept short. An ideal test contact arrangement has short signal paths.

Third, solders commonly in use today for device terminals are mainly tin for environmental purposes. Tin-based solder alloys are likely to develop an oxide film on the outer surface that conducts poorly. Older solder alloys include substantial amounts of lead, which do not form oxide films. The test contacts must be able to penetrate the oxide film present.

BGA test contacts currently known and used in the art employ spring contacts made up of multiple pieces including a spring, a body and top and bottom plungers.

United States Patent Application Publication No. US 2003/0192181 A1, titled "Method of making an electronic contact" and published on Oct. 16, 2003, shows microelectronic contacts, such as flexible, tab-like, cantilever contacts, which are provided with asperities disposed in a regular pattern. Each asperity has a sharp feature at its tip remote from the surface of the contact. As mating microelectronic elements are engaged with the contacts, a wiping action causes the sharp features of the asperities to scrape the mating element, so as to provide effective electrical interconnection and, optionally, effective metallurgical bonding between the contact and the mating element upon activation of a bonding material.

According to United States Patent Application Publication No. US 2004/0201390 A1, titled "Test interconnect for bumped semiconductor components and method of fabrication" and published on Oct. 14, 2004, an interconnect for testing semiconductor components includes a substrate, and contacts on the substrate for making temporary electrical connections with bumped contacts on the components. Each contact includes a recess and a pattern of leads cantilevered over the recess configured to electrically engage a bumped contact. The leads are adapted to move in a z-direction within the recess to accommodate variations in the height and planarity of the bumped contacts. In addition, the leads can include projections for penetrating the bumped contacts, a non-bonding outer layer for preventing bonding to the bumped contacts, and a curved shape which matches a topography of the bumped contacts. The leads can be formed by forming a patterned metal layer on the substrate, by attaching a polymer substrate with the leads thereon to the substrate, or by etching the substrate to form conductive beams.

According to U.S. Pat. No. 6,246,249 B1, titled "Semiconductor inspection apparatus and inspection method using the apparatus" and issued on Jun. 12, 2001 to Fukasawa, et al., a semiconductor inspection apparatus performs a test on a to-be-inspected device which has a spherical connection terminal. This apparatus includes a conductor layer formed on a supporting film. The conductor layer has a connection portion. The spherical connection terminal is connected to the connection portion. At least a shape of the connection portion is changeable. The apparatus further includes a shock absorbing member, made of an elastically deformable and insulating material, for at least supporting the connection portion. A test contact element of the invention for making temporary electrical contact with a microcircuit terminal comprises at least one resilient finger projecting from an insulating contact membrane as a cantilevered beam. The finger has on a contact side thereof, a conducting contact pad for contacting the microcircuit terminal.

In U.S. Pat. No. 5,812,378, titled "Microelectronic connector for engaging bump leads" and issued on Sep. 22, 1998 to Fjelstad, et al., a connector for microelectronic includes a sheet-like body having a plurality of holes, desirably arranged in a regular grid pattern. Each hole is provided with a resilient laminar contact such as a ring of a sheet metal having a plurality of projections extending inwardly over the hole of a first major surface of the body. Terminals on a second surface of the connector body are electrically connected to the contacts. The connector can be attached to a substrate such a multi-layer circuit panel so that the terminals on the connector are electrically connected to the leads within the substrate. Microelectronic elements having bump leads thereon may be engaged with the connector and hence connected to the substrate, by advancing the bump leads into the holes of the connector to engage the bump leads with the contacts. The assembly can be tested, and if found acceptable, the bump leads can be permanently bonded to the contacts.

According to United States Patent Application Publication No. US 2001/0011907 A1, titled "Test interconnect for bumped semiconductor components and method of fabrication" and published on Aug. 9, 2001, an interconnect for testing semiconductor components includes a substrate, and contacts on the substrate for making temporary electrical connections with bumped contacts on the components. Each contact includes a recess and a support member over the recess configured to electrically engage a bumped contact. The support member is suspended over the recess on spiral leads formed on a surface of the substrate. The spiral leads allow the support member to move in a z-direction within the recess to accommodate variations in the height and planarity of the bumped contacts. In addition, the spiral leads twist the support member relative to the bumped contact to facilitate penetration of oxide layers thereon. The spiral leads can be formed by attaching a polymer substrate with the leads thereon to the substrate, or by forming a patterned metal layer on the substrate. In an alternate embodiment contact, the support member is suspended over the surface of the substrate on raised spring segment leads.

Consider an electrical chip that is manufactured to be incorporated into a larger system. When in use, the chip electrically connects the device to the larger system by a series of contacts or terminals. For instance, the contacts on the electrical chip may plug into corresponding sockets in a computer, so that the computer circuitry may electrically connect with the chip circuitry in a predetermined manner. An example of such a chip may be a memory card or processor for a computer, each of which may be insertable into a particular slot or socket that makes one or more electrical connections with the chip.

It is highly desirable to test these chips before they are shipped, or before they are installed into other systems. Such component-level testing may help diagnose problems in the manufacturing process, and may help improve system-level yields for systems that incorporate the chips. Therefore, sophisticated test systems have been developed to ensure that the circuitry in the chip performs as designed. The chip is attached to the tester, as a "device under test", is tested, and is then detached from the tester. In general, it is desirable to perform the attachment, testing, and detachment as rapidly as possible, so that the throughput of the tester may be as high as possible.

The test systems access the chip circuitry through the same contacts or terminals that will later be used to connect the chip in its final application. As a result, there are some general requirements for the test system that perform the testing. In general, the tester should establish electrical contact with the various contacts or terminals so that the contacts are not damaged, and so that a reliable electrical connection is made with each contact.

Most testers of this type use mechanical contacts between the chip I/O contacts and the tester contacts, rather than soldering and de-soldering or some other attachment method. When the chip is attached to the tester, each contact on the chip is brought into mechanical and electrical contact with a corresponding pad on the tester. After testing, the chip is removed from the tester, and the mechanical and electrical contacts are broken.

In general, it is highly desirable that the chip and the tester both undergo as little damage as possible during the attachment, testing, and detachment procedures. Pad layouts on the tester may be designed to reduce or minimize wear or damage to the chip contacts. For instance, it is not desirable to scrape the device I/O (leads, contacts, pads or balls), bend or deflect the I/O, or perform any operation that might permanently change or damage the I/O in any way. Typically, the testers are designed to leave the chips in a final state that resembles the initial state as closely as possible. In addition, it is also desirable to avoid or reduce any permanent damage to the tester or tester pads, so that tester parts may last longer before replacement.

There is currently a great deal of effort spent by tester manufacturers on the pad layouts. For instance, the pads may include a spring-load mechanism that receives the chip contacts with a prescribed resisting force. In some applications, the pads may have an optional hard stop at the extreme end of the spring-load force range of travel. The goal of the pad layout is to establish a reliable electrical connection with the corresponding chip contacts, which may be as close as possible to a "closed" circuit when the chip is attached, and may be as close as possible to an "open" circuit when the chip is detached.

Because it is desirable to test these chips as quickly as possible, or simulate their actual use in a larger system, it may be necessary to drive and/or receive electrical signals from the contacts at very high frequencies. The test frequencies of current-day testers may be up to 40 GHz or more, and the test frequencies are likely to increase with future generation testers.

For low-frequency testing, such as that done close to DC (0 Hz), the electrical performance may be handled rather simplistically: one would want an infinitely high resistance when the chip is detached, and an infinitesimally small resistance when the chip is attached.

At higher frequencies, other electrical properties come into play, beyond just resistance. Impedance (or, basically, resistance as a function of frequency) becomes a more proper measure of electrical performance at these higher frequencies. Impedance may include phase effects as well as amplitude effects, and can also incorporate and mathematically describe the effects of resistance, capacitance and inductance in the electrical path. In general, it is desirable that the contact resistance in the electrical path formed between the chip I/O and the corresponding pad on the load card be sufficiently low, which maintains a target impedance of 50 ohms, so that the tester itself does not significantly distort the electrical performance of the chip under test. Note that most test equipment is designed to have 50 ohm input and output impedances.

For modern-day chips that have many, many closely spaced I/O, it becomes helpful to simulate the electrical and mechanical performance at the device I/O interface. Finite-element modeling in two-or three dimensions has become a tool of choice for many designers. In some applications, once a basic geometry style has been chosen for the tester pad configuration, the electrical performance of the pad configuration is simulated, and then the specific sizes and shapes may be iteratively tweaked until a desired electrical performance is achieved. For these applications, the mechanical performance may be determined almost as an afterthought, once the simulated electrical performance has reached a particular threshold.

BRIEF SUMMARY OF THE INVENTION

An embodiment is a device for forming a plurality of temporary mechanical and electrical connections between a device under test having a plurality of terminals and a load board having a plurality of contact pads, each contact pad being laterally arranged to correspond to exactly one terminal, comprising: a laterally oriented, electrically insulating housing longitudinally adjacent to the contact pads on the load board; a plurality of electrically conductive force contacts extending through longitudinal holes in the housing toward the device under test and being compressible/deflectable through the holes in the housing, each force contact in the plurality being laterally arranged to correspond to exactly one terminal; and a plurality of electrically conductive sense contacts, each sense contact in the plurality being laterally arranged to correspond to exactly one force contact and exactly one terminal, each sense contact in the plurality extending toward the device under test proximate the corresponding force contact. Each sense contact in the plurality includes a fixed portion, a free portion extending hingedly away from the housing, and a hinged portion connecting the fixed portion and the free portion. The hinged portion is laterally separated from the corresponding force contact. The free portion includes a forked portion at its distal end that extends on opposite sides of a distal end of the corresponding force contact. The fixed portion is meant to indicate that it is a point along the contact where flexure is limited for prevented. The location of the fixed portion or point relative to the tip determines flexure, all other things being equal.

An additional embodiment is a device for forming a plurality of temporary mechanical and electrical connections between a device under test having a plurality of terminals and a load board having a plurality of contact pads, each contact pad being laterally arranged to correspond to exactly one terminal, comprising: a laterally oriented, electrically insulating housing longitudinally adjacent to the contact pads on the load board; a plurality of electrically conductive force contacts extending through longitudinal holes in the housing toward the device under test and being compressible/deflectable through the holes in the housing, the compressibility including a lateral translation of a lateral cross-section of each force contact, each force contact in the plurality being laterally arranged to correspond to exactly one terminal; and a plurality of electrically conductive sense contacts, each sense contact in the plurality being laterally arranged to correspond to exactly one force contact and exactly one terminal, each sense contact in the plurality laterally surrounding the corresponding force contact and being horizontal/laterally slidable along the housing, the horizontal/lateral sliding corresponding to the horizontal lateral translation of the horizontal/lateral cross-section of the corresponding force contact such as in FIG. 8.

A further embodiment is a device for forming a plurality of temporary mechanical and electrical connections between a device under test having a plurality of terminals and a load board having a plurality of contact pads, each contact pad being laterally arranged to correspond to exactly one terminal, comprising: a laterally oriented, electrically insulating housing longitudinally adjacent to the contact pads on the load board; a plurality of electrically conductive force contacts extending through longitudinal holes in the housing toward the device under test and being compressible/deflectable through the holes in the housing, each force contact in the plurality being laterally arranged to correspond to exactly one terminal; and a plurality of electrically conductive sense contacts, each sense contact in the plurality being laterally arranged to correspond to exactly one force contact and exactly one terminal. Each sense contact in the plurality includes a pair of electrically conductive rods extending generally laterally along the housing. The pair of electrically conductive rods fit within corresponding channels in the electrically insulating housing. Each conductive rod in the pair has a distal end bent out of the plane of the housing toward the device under test to hit exposed I/O pads under the device under test. The two distal ends in each sense pair of rods are directly adjacent to and are on opposite sides of the corresponding force contact.

BRIEF DESCRIPTION OF THE SEVERAL VIEWS OF THE DRAWINGS

FIG. 15 is a side-view schematic drawing of a pair of sense contacts having tips that are angled away from the central force (current) contact.

DETAILED DESCRIPTION OF THE INVENTION

A general summary of the disclosure follows.

The terminals of a device under test are temporarily electrically connected to corresponding contact pads on a load board by a series of electrically conductive contacts. The terminals may be pads, balls, wires (leads) or other contact points. Each terminal that undergoes Kelvin testing connects with both a "force" contact and a "sense" contact, with each contact electrically connecting to a respective, single contact pad on the load board. The force contact delivers a known amount of current to or from the terminal, and the sense contact measures a voltage at the terminal and draws a negligible amount of current to or from the terminal. The sense contact partially or completely laterally surrounds the force contact, so that it need not have its own resiliency, though it may also be resilient in its own right. This helps keep the force contact in alignment by preventing lateral wobbling. In a first case, the sense contact has a forked end with prongs that extend to opposite sides of the force contact. In a second case, the sense contact completely laterally surrounds the force contact and slides horizontally/laterally to match a horizontal translation component of a horizontal cross-section of the force contact during vertical compression of the force contact. In a third case, the sense contact includes two rods that have ends on opposite sides of the force contact, and extend parallel and laterally away from the force contact. In these cases, the sense contact extends horizontally along a membrane or housing that supports the force contacts. The rods may be housed in respective channels along the membrane or in the housing.

The preceding paragraph is merely a summary of the disclosure, and should not be construed as limiting in any way. The test device is described in much greater detail below.

Figure 1:
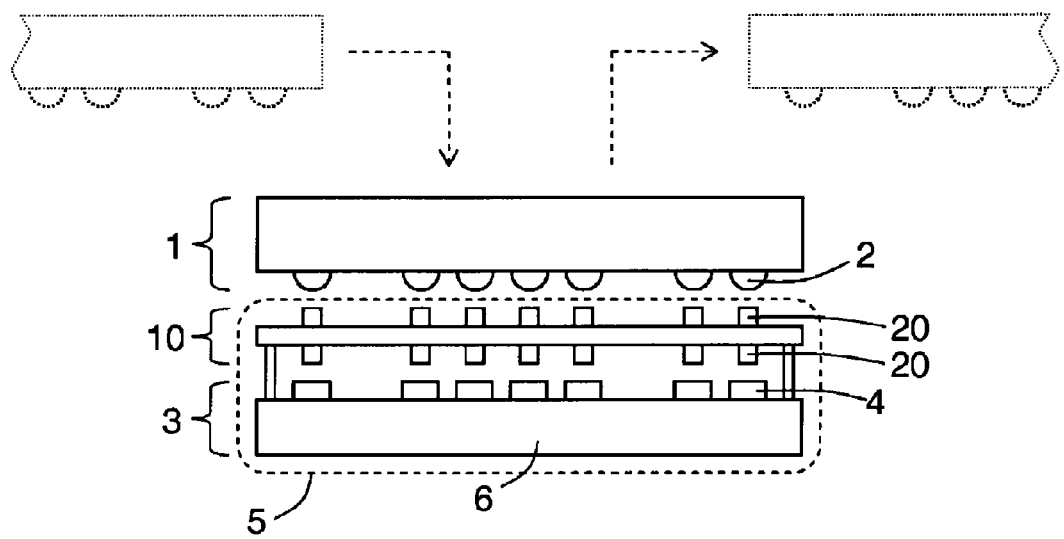
FIG. 1 is a side-view drawing of a portion of the test equipment for receiving a device under test (DUT), for standard electrical testing.
Figure 2:
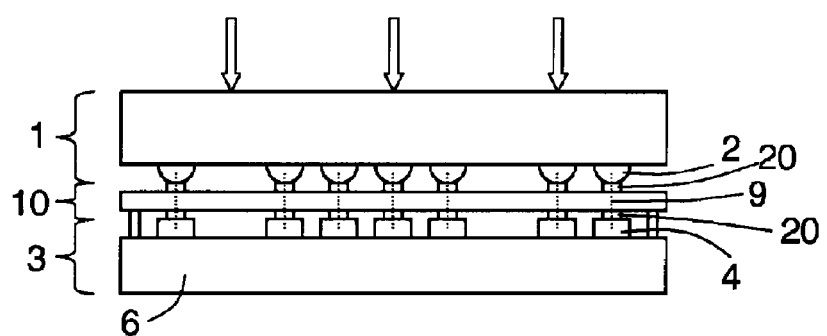
FIG. 2 is a side-view drawing of the test equipment of FIG. 1, with the DUT electrically engaged.
Figure 3:
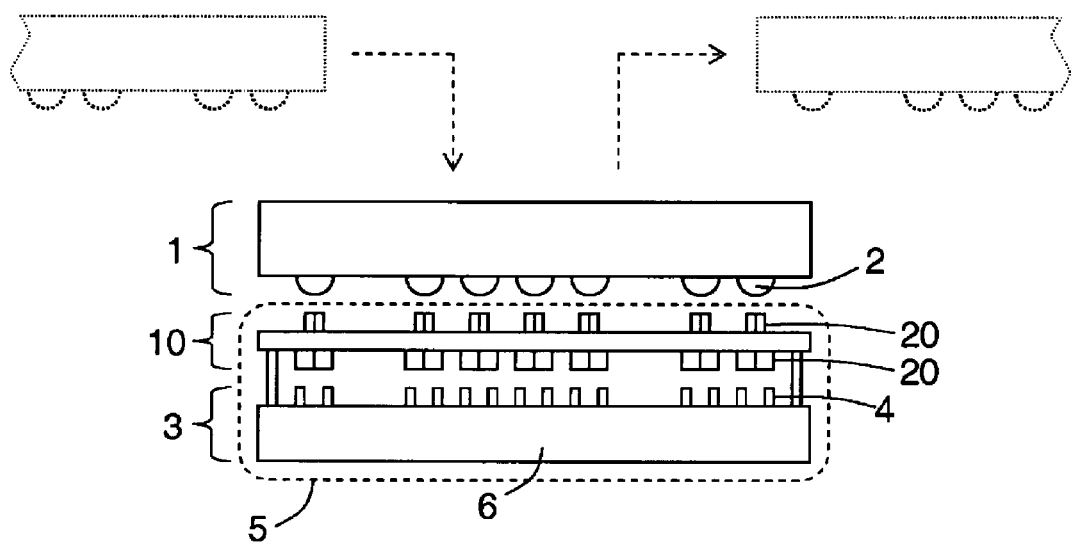
FIG. 3 is a side-view drawing of a portion of the test equipment for receiving a device under test (DUT), for Kelvin testing.
Figure 4:
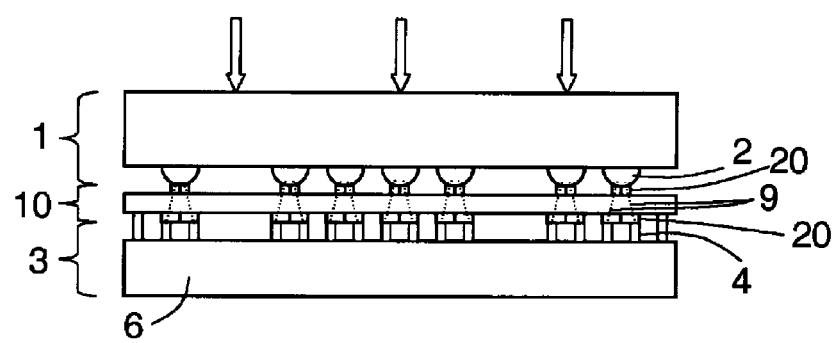
FIG. 4 is a side-view drawing of the test equipment of FIG. 3, with the DUT electrically engaged.

FIGS. 1 and 2 show a tester that performs conventional electrical testing, in which there is one-to-one correspondence between the terminals on the device under test and the contact pads on the load board. In contrast, FIGS. 3 and 4 show a tester that performs Kelvin testing, in which there are two contact pads on the load board connected to each terminal on the device under test. Despite their differences between conventional and Kelvin testing, the tester elements have a great deal in common. As such, they are first described with regard to FIGS. 1 and 2. Following their description for conventional testing, the elements are then described as used with Kelvin testing, as shown in FIGS. 3 and 4. Differences between the cases are highlighted at this point in the description.

FIG. 1 is a side-view drawing of a portion of the test equipment for receiving a device under test (DUT) 1, for conventional electrical testing. The DUT 1 is placed onto the tester 5, electrical testing is performed, and the DUT 1 is then removed from the tester 5. Any electrical connections are made by pressing components into electrical contact with other components; there is no soldering or de-soldering at any point in the testing of the DUT 1.

The entire electrical test procedure may only last about a fraction of a second, so that rapid, accurate placement of the device under test 1 becomes important for ensuring that the test equipment is used efficiently. The high throughput of the tester 5 usually requires robotic handling of the devices under test 1. In most cases, an automated mechanical system places the DUT 1 onto the tester 5 prior to testing, and removes the DUT 1 once testing has been completed. The handling and placement mechanism may use mechanical and optical sensors to monitor the position of the DUT 1, and a combination of translation and rotation actuators to align and place the DUT 1 on the testbed. Such automated mechanical systems are mature and have been used in many known electrical testers; these known robotic systems may also be used with any or all of the tester elements disclosed herein. Alternatively, the DUT 1 may be placed by hand, or placed by a combination of hand-fed and automated equipment.

Likewise, the electrical algorithms that are used to test each terminal on the DUT 1 are well established, and have been used in many known electrical testers. These known electrical algorithms may also be used with any or all of the tester elements disclosed herein.

The device under test 1 typically includes one or more devices, and includes signal and power terminals that connect to the device. The device and terminals may be on one side of the device under test 1, or may be on both sides of the device under test 1. For use in the tester 5, all the terminals 2 should be accessible from one side of the device under test 1, although it will be understood that there may be one or more elements on the opposite side of the device under test 1, or that there may be other elements and/or terminals on the opposite side that may not be tested by accessing terminals 2.

Each terminal 2 is formed as a small, pad on button side of device or possibly a lead protruding from the body of the device. Prior to testing, the pad or lead 2 is attached to an electrical lead that connects internally to other leads, to other electrical components, and/or to one or more chips in the device under test 1. The volume and size of the pads or leads may be controlled quite precisely, and there is typically not much difficulty caused by pad-to-pad or lead-to-lead size variations or placement variations. During testing, the terminals 2 remain solid, and there is no melting or re-flowing of any solder 2.

The terminals 2 may be laid out in any suitable pattern on the surface of the device under test 1. In some cases, the terminals 2 may be in a generally square grid, which is the origin of an expression that describes the device under test 1, QFN, DFN, MLF or QFP for leaded parts. There may also be deviations away from a rectangular grid, including irregular spacings and geometries. It will be understood that the specific locations of the terminals may vary as needed, with corresponding locations of pads on the load board and contacts on the membrane or housing being chosen to match those of the device under test terminals 2. In general, the spacing between adjacent terminals 2 is in the range of 0.25 to 1.5 mm, with the spacing being commonly referred to as a "pitch".

When viewed from the side, as in FIG. 1, the device under test 1 displays a line of terminals 2, which may optionally include gaps and irregular spacings. These terminals 2 are made to be generally planar, or as planar as possible with typical manufacturing processes. In many cases, if there are chips or other elements on the device under test 1, the protrusion of the chips is usually less than the protrusion of the terminals 2 away from the device under test 1.

The tester 5 of FIG. 1 includes a load board 3.

The load board 3 includes a load board substrate 6 and circuitry that is used to test electrically the device under test 1. Such circuitry may include driving electronics that can produce one or more AC voltages having one or more particular frequencies, and detection electronics that can sense the response of the device under test 1 to such driving voltages. The sensing may include detection of a current and/or voltage at one or more frequencies. Such driving and sensing electronics is well known in the industry, and any suitable electronics from known testers may be used with the tester elements disclosed herein.

In general, it is highly desirable that the features on the load board 3, when mounted, are aligned with corresponding features on the device under test 1. Typically, both the device under test 1 and the load board 3 are mechanically aligned to one or more locating features on the tester 5. The load board 3 may include one or more mechanical locating features, such as fiducials or precisely-located holes and/or edges, which ensure that the load board 3 may be precisely seated on the tester 5. These locating features typically ensure a lateral alignment (x, y) of the load board, and/or a longitudinal alignment (z) as well. The mechanical locating features are well known in the industry, and any suitable electronics from known testers may be used with the tester elements disclosed herein. The mechanical locating features are not shown in FIG. 1.

In general, the load board 3 may be a relatively complex and expensive component. In many cases, it may be advantageous to introduce an additional, relatively inexpensive element into the tester 5 that protects the contact pads 4 of the load board 3 from wear and damage. Such an additional element may be an interposer membrane 10. The interposer membrane 10 also mechanically aligns with the tester 3 with suitable locating features (not shown), and resides in the tester 5 above the load board 3, facing the device under test 1.

The interposer membrane 10 includes a series of electrically conductive contacts 20, which extend longitudinally outward on either side of the membrane 10. Each contact 20 may include a resilient element, such as a spring or an elastomer material, and is capable of conducting an electrical current to/from the load board from/to the device under test with sufficiently low resistance or impedance. Each contact may be a single conductive unit, or may alternatively be formed as a combination of conductive elements.

In general, each contact 20 connects one contact pad 4 on the load board 3 to one terminal 2 on the device under test 1, although there may be testing schemes in which multiple contact pads 4 connect to a single terminal 2, or multiple terminals 2 connect to a single contact pad 4. For simplicity, we assume in the text and drawings that a single contact 20 connects a single pad to a single terminal, although it will be understood that any of the tester elements disclosed herein may be used to connect multiple contact pads connect to a single terminal, or multiple terminals to a single contact pad. Typically, the interposer membrane 10 electrically connects the load board pads and the bottom contact surface of the test contactor. It may alternatively be used to convert an existing load board pad configuration to a vehicle, which is a test socket used to connect and test a device under test.

Although the interposer membrane 10 may be removed and replaced relatively easily, compared with removal and replacement of the load board 3, we consider the interposer membrane 10 to be part of the tester 5 for this document. During operation, the tester 5 includes the load board 3, the interposer membrane 10, and the mechanical construction that mounts them and holds them in place (not shown). Each device under test 1 is placed against the tester 5, is tested electrically, and is removed from the tester 5.

A single interposer membrane 10 may test many devices under test 1 before it wears out, and may typically last for several thousand tests or more before requiring replacement. In general, it is desirable that replacement of the interposer membrane 10 be relatively fast and simple, so that the tester 5 experiences only a small amount of down time for membrane replacement. In some cases, the speed of replacement for the interposer membrane 10 may even be more important than the actual cost of each membrane 10, with an increase in tester up-time resulting in a suitable cost savings during operation.

FIG. 1 shows the relationship between the tester 5 and the devices under test 1. When each device 1 is tested, it is placed into a suitable robotic handler with sufficiently accurate placement characteristics, so that a particular terminal 2 on the device 1 may be accurately and reliably placed (in x, y and z) with respect to corresponding contacts 20 on the interposer membrane 10 and corresponding contact pads 4 on the load board 3.

The robotic handler (not shown) forces each device under test 1 into contact with the tester 5. The magnitude of the force depends on the exact configuration of the test, including the number of terminals 2 being tested, the force to be used for each terminal, typical manufacturing and alignment tolerances, and so forth. In general, the force is applied by the mechanical handler of the tester (not shown), acting on the device under test 1. In general, the force is generally longitudinal, and is generally parallel to a surface normal of the load board 3.

FIG. 2 shows the tester and device under test 1 in contact, with sufficient force being applied to the device under test 1 to engage the contacts 20 and form an electrical connection 9 between each terminal 2 and its corresponding contact pad 4 on the load board 3. As stated above, there may alternatively be testing schemes in which multiple terminals 2 connect to a single contact pad 4, or multiple contact pads 4 connect to a single terminal 2, but for simplicity in the drawings we assume that a single terminal 2 connects uniquely to a single contact pad 4.

FIGS. 1 and 2 above show conventional electrical testing, which essentially answers the question, "Is Terminal A electrically connected at all to Terminal B?" Currents are driven from the load board to a particular terminal on the device under test, pass internally in the device under test to another terminal, then return to the load board.

In contrast with conventional electrical testing, Kelvin testing essentially answers the question, "What is the electrical resistance between Terminal A and Terminal B?" As with conventional testing, currents are driven from the load board to a terminal, internally to another terminal, and back to the load board. However, in Kelvin testing, each terminal electrically contacts two contacts simultaneously. One contact in the pair supplies the known amount of current (I), as is done in conventional testing, while the other contact in the pair measures a voltage (V) without drawing a significant amount of current. From known amounts of current (I) and voltage (V), Ohm's Law (V=IR) may be used to determine the resistance R (=V/I) between two particular terminals on the load board.

The force or "current" contact may be considered a low-resistance or low-impedance contact, while the sense or "voltage" contact may be considered a high-resistance or high-impedance contact. Note that a typical voltmeter operates in a manner similar to that of the high-resistance sense or "voltage" contacts.

FIGS. 3 and 4 show a tester that performs Kelvin testing. Many of the elements are analogous to those of the conventional tester shown in FIGS. 1 and 2, and are numbered accordingly.

Figure 12:
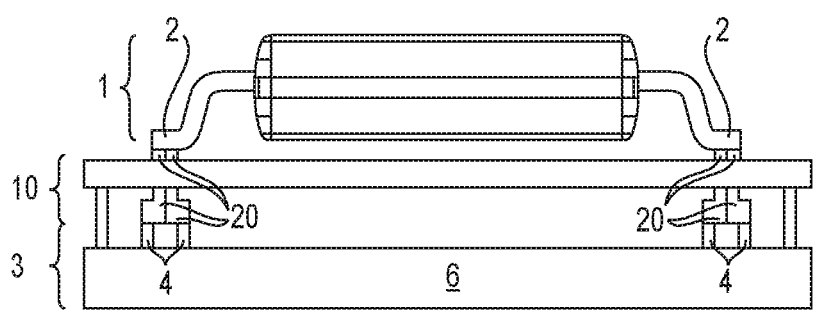
FIG. 12 is a side-view drawing of two sets of terminal/contacts, for the test equipment of FIGS. 3 and 4, with the DUT electrically engaged.

Note that there is a pair of contact pads 4 for every terminal 2, with one in the pair for current, and the other for voltage. There is also a pair of contacts 20 for every terminal 2 and every pair of contact pads 4, with each contact electrically connecting a contact pad 4 to the corresponding terminal 2. Note that the two contacts in each pair are generally electrically insulated from each other, and form electrical connections 9 between the terminal 2 and the contact pad 4. FIG. 12 shows a close-up view of two pairs of terminal/contacts, for the test equipment of FIGS. 3 and 4.

In the schematic drawings of FIGS. 3 and 4, the contacts 20 are drawn as being similar in shape and size, and being located adjacent to each other, so that the terminal makes contact with both contacts at the same time. While this may be sufficient from an electrical point of view, mechanically it leaves much to be desired. For instance, the terminal may be laterally misaligned with respect to the contact pair, so that the terminal contacts one contact but misses the other. In addition, a membrane having such a Kelvin testing scheme may be far more mechanically complicated than a comparable conventional testing method, because the number of contacts is essentially doubled, while the lateral area for the contacts remains the same. In general, it is mechanically challenging to fit so many contacts in so small an area, due to the tiny size of the parts, and the need for springs, elastomers, or some other mechanical resistance-producing device for each contact to generate z axis compliance. As a result, there exists a need for an improved mechanical layout for the electrical scheme shown in FIGS. 3 and 4. The remainder of this document addresses such a need, and presents various mechanical layouts that are improvements over the side-by-side design of FIGS. 3 and 4.

One simplifying feature is relying mainly or solely on the force (current) contact for resiliency, i.e., the springiness or resisting force that pushes back on the terminal when the device under test is forced into contact with the tester. This reduces the mechanical complexity required for the sense (voltage) contact.

In addition, in some cases, the sense contact may have less strict electrical requirements than the force contact, since the purpose of the sense contact is to measure voltage without drawing a significant amount of current. Such a low current flow may allow the sense contact to be thinner than the force contact, and may allow the sense contact to bend into a variety of shapes and orientations. Some of these shapes may be acceptable for the sense contact, but might show unacceptable high-frequency performance if they were used for the more electrically-demanding force contact.

Removing the resiliency from the sense contact and relaxing the criteria on electrical performance may allow for a variety of possible orientations and shapes for the sense contact.

For example, one end of the sense contact may lie adjacent to the top end of the force contact. The sense contact may then extend generally laterally along the top surface of the interposer or housing (sometimes called membrane), may curve downward through a hole in the housing, and may contact the corresponding contact pad on the load board after passing through the housing.

Figure 5:
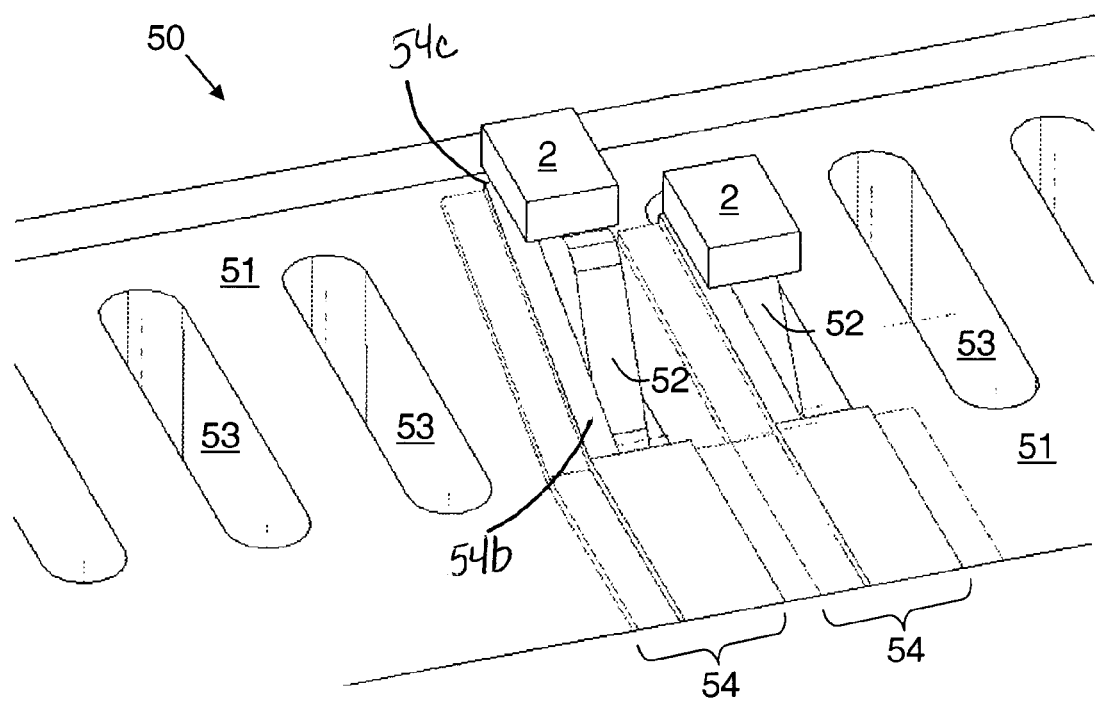
FIG. 5 is a plan drawing of a first design of force and sense contacts on the test equipment.

The design 50 of FIG. 5 shows a portion of an exemplary housing 51, an array of holes 53 through the housing 51 that are laterally arranged to correspond to terminals 2 on the device under test 1, two exemplary force (current) contacts protruding upward (toward the device under test 1) through the holes 53, two exemplary sense (voltage) contacts 54 extending laterally away from the top of the force contacts 52, and two exemplary terminals 2 on the device under test 1 that each contact both a force contact 52 and a sense contact 54. The leftmost exemplary terminal 2 corresponds to when the device under test 1 is just barely contacting the tester 5, and the rightmost exemplary terminal 2 corresponds to when the device under test 1 is forced into contact with the tester 5.

On each force contact 52, there is a notch removed from the top end that accommodates a portion of the far end of the sense contact 54. When the device under test 1 is forced into contact with the tester 5, each terminal 2 mechanically and electrically contacts both the respective force contact 52 and the respective sense contact 54. Contact 54 has a planar arm 54a, an extension 54b which rises from the housing surface preferably along a line to contact point 54c. The extension 54b may also be arcuate, concave or convex. The point of contact 54c is preferably at the sharp corner intersection at its end. The sharp corner assists in removing oxide on the terminal 2 during insertion.

For the case in which there is little or no contact force applied (the leftmost terminal 2 shown in FIG. 5), the force contact 52 protrudes upward under the influence of its own resiliency. A portion of the far end of the sense contact 54 is bent upwards as well so that its tines 54a (in FIG. 6) are angled at 20-30 degrees (ie 20 degrees or 21 . . . 30 degrees) from the plane of portion 64. Tines 54a are also taper inwardly toward the force contact 62, preferably in a straight line to form a triangular tip (FIG. 6) or rectangular (FIG. 5) but may also follow an arcuate line toward the tip. The sense contact 54 may have a fixed portion, attached to or integrally formed with the housing 51, a hinged portion laterally separated from the force contact 52, and a free portion beyond the hinged portion that extends toward the top end of the force contact 52.

The sense contacts 54 may be formed in layers and mounted to the top surface of the housing 51, or on a membrane resting on the housing 51. For instance, the layer closest to the housing 51 may be a semi-rigid film-like layer, which is electrically non-conducting. Such a layer may be formed from polyimide, kapton, PEEK, or any other suitable material. An electrically conducting layer may be deposited on top of the film-like insulator, and may be deposited in non-overlapping stripes, with each stripe corresponding to a particular terminal 2.

Such a layered structure for the sense contacts 54 may be used with any suitable configuration for the force contacts 52, since there are no added elements inside the housing directly between any of the force contacts 52. An example of force contacts 52 that may be used is disclosed in U.S. Pat. No. 5,749,738, titled "Electrical interconnect contact system", and issued on May 12, 1998 to Johnson et al. Other suitable force contacts 52 may be used as well.

Note that there may be some beneficial wiping of the terminal 2 from the sense contact 54 to reduce contact resistance due to oxide build up. Because the hinged portion is relatively close to the current contact, the free portion is relatively short compared to the vertical deflection range of the current contact. As a result, there is a significant lateral component to the vertical compression of the sense contact 54. In practical terms, this means that when the terminal 2 on the device under test 1 initially contacts the sense contact 54, it makes contact at a particular location on the terminal 2. As the terminal 2 further deflects/compresses the sense contact 54, the sense contact 54 slides horizontally, though not sideways toward the force contact across the terminal 2. This sliding is generally considered beneficial, as it can break through any oxide layers that have built up on the terminal 2.

The specific geometry of the contacts determines the precise amount of sliding. For a rigid free portion of length L that begins its travel extended upward by angle A and ends its travel flush with the housing (angle of 0), the horizontal extent of the wiping travel is L (1−cos A). Note that the vertical extent of the travel is L (sin A). In practical terms, if the free portion is too long, then there is not enough lateral travel to produce significant wiping. Likewise, if the free portion is too short, then there is risk of damaging the free portion during use by bending or breaking an extending portion of the contact.

Figure 6:
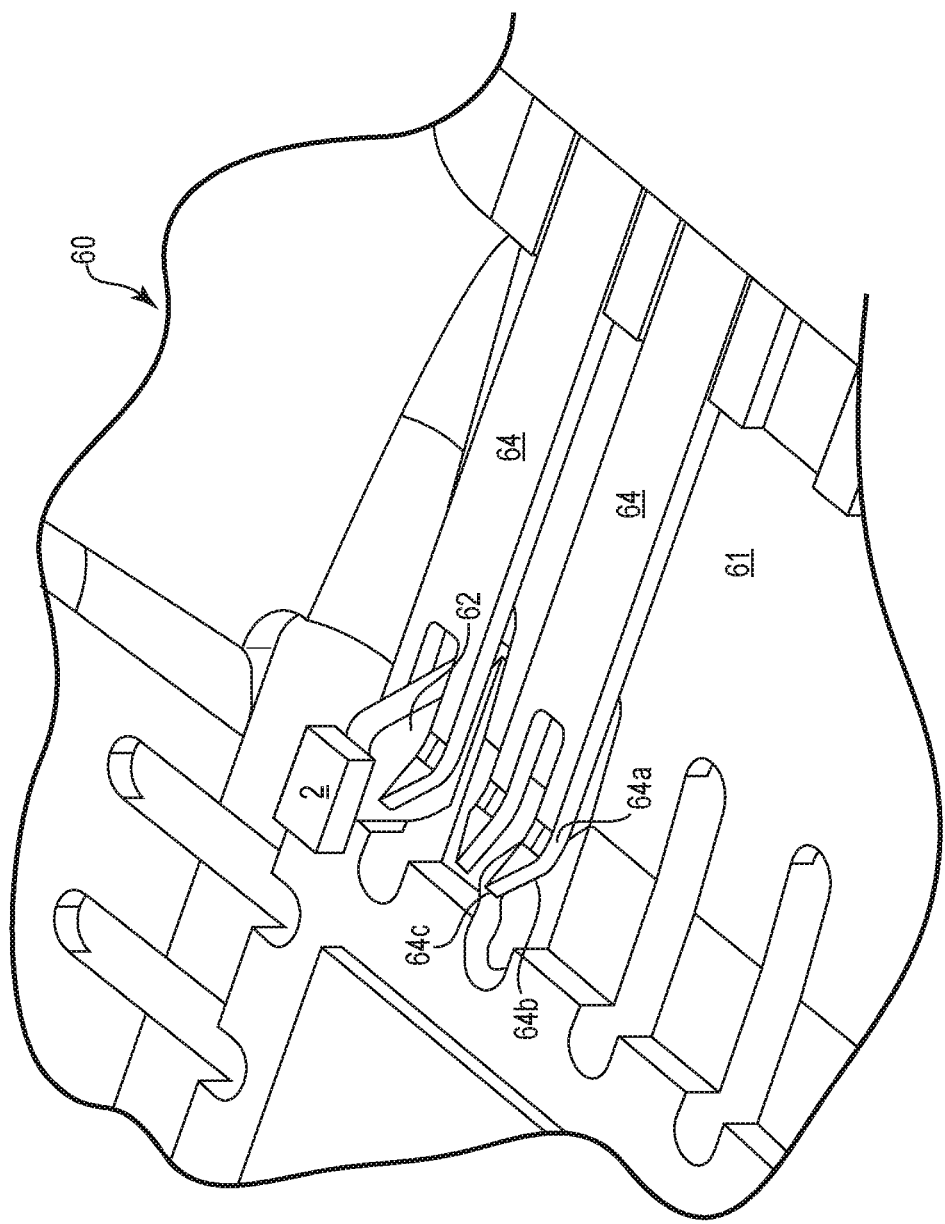
FIG. 6 is a plan drawing of a second design of force and sense contacts on the test equipment.

FIG. 6 shows another mechanical design 60 for the sense (voltage) contacts 64. Here, each sense contact 64 forms a fork with prongs that extend onto opposite sides of the corresponding force contact 62. The sense contact 64 prongs help keep the force contact 62 laterally aligned during use by preventing or reducing lateral wobbling. By having potential connections on both sides of the force contacts 62, any device misalignment will result in making contact with at least one side of the fork.

Figure 13:
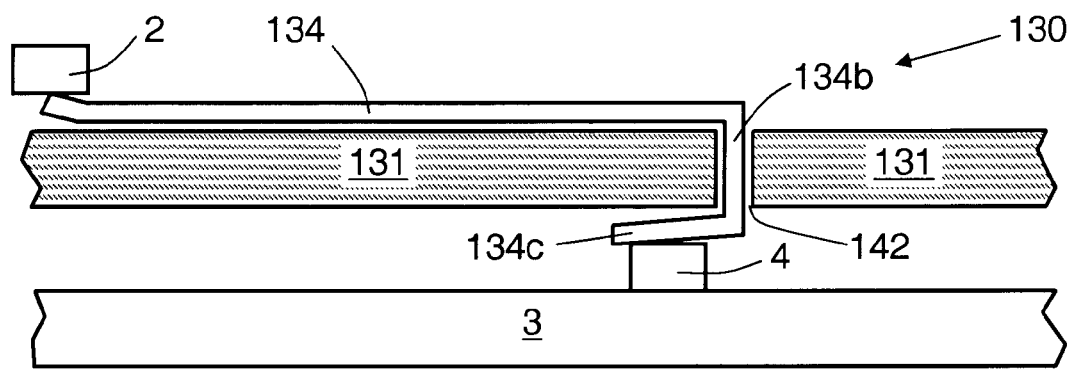
FIG. 13 is side-view cross-sectional drawing of a sample geometry of a sense (voltage) contact in its path from the terminal on the device under test to the contact pad on the load board.
Figure 14:
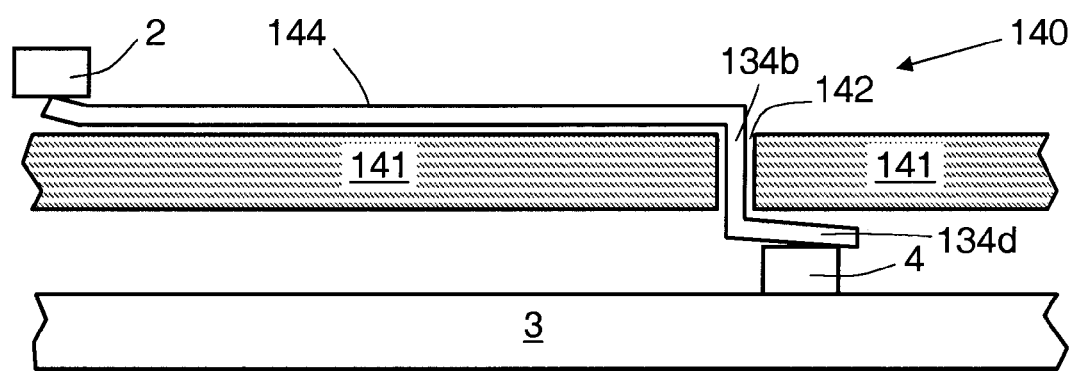
FIG. 14 is side-view cross-sectional drawing of another sample geometry of a sense (voltage) contact in its path from the terminal on the device under test to the contact pad on the load board.

In this case, away from the fork, the sense contact 64 is a solid, conducting member that lies on top of the test contactor housing 61. The sense contact 64 extends horizontally away from the force contact 62, curves downward through a hole in the housing 61, emerges from the housing 61 and contacts the corresponding contact pad 4 on the load board 3 as shown in FIGS. 13 and 14.

Each prong on the fork includes an upward-bending tip, which is angled partially or fully toward the device under test 1. When the device under test 1 is forced into contact with the tester 5, the terminal 2 contacts the top end of the force contact 62 and the upward-bending tips on the prongs of the sense contact 64. The upward-bending tips may be rigid (with a well-defined angle that does not significantly vary during use), or may be spring-bendable. The upward bent tips also enables the sense contact to avoid any protruding burrs on the device itself.

For the case of rigid (non-bending) tips, there is some wiping of oxides from the terminal. The sharp points on the tips break through the oxides on the terminal. For the case of bendable tips, there may be appreciable wiping, in the manner described above with respect to FIG. 5. As terminal 2 contacts the sense contact tips, the sense contact is deflected vertically, allowing the horizontal portion of the sense contact along the surface of the housing to flex. This provides the contact force between the sense contact and terminal 2.

In the design 60 of FIG. 6, the housing 61 may include an inset in the region around or near the force contacts 62, so that the sense contacts 64 may be recessed slightly into the housing. Contacts 64 may include a planar portion 64a, a rising portion 64b and a pair of fork tines 64c. The tines 64c may have a sharp or pointed contact engagement surface which will remove oxide from the terminal 2. Rising portion 64b may be linear (a line) or follow a curved path to the tip 64c. Tines 64c may have triangular teeth as shown or other tapered or non tapered structures. Preferably, tines 64b surround on 2, 3 or 4 sides of contact 62 to help guide its alignment.

Figure 11:
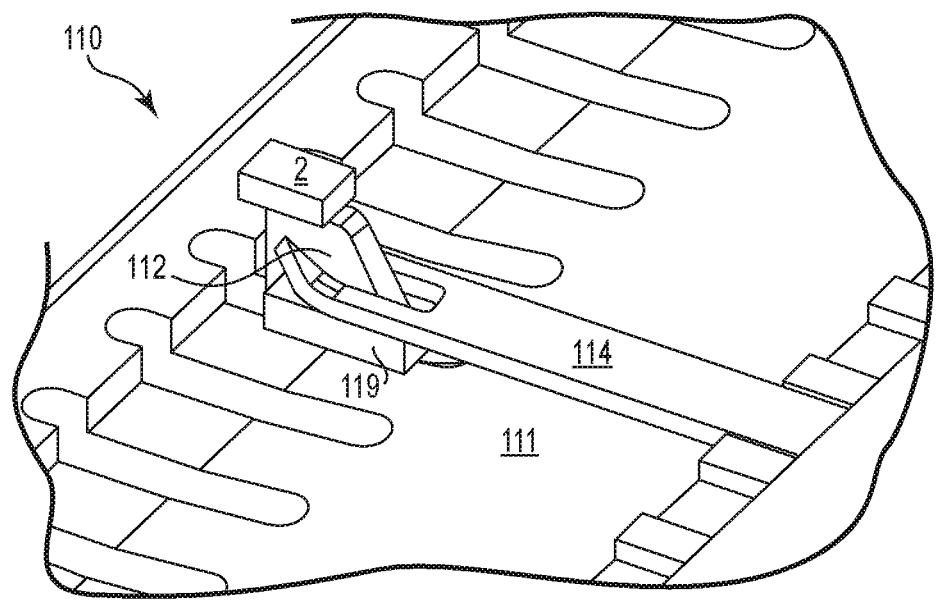
FIG. 11 is a plan drawing of a seventh design of force and sense contacts on the test equipment.

FIG. 11 shows a design 110 in which the sense contacts 114 may have additional resiliency provided by an elastomer material "pillow" 119 (or a cylinder 519 FIG. 22), disposed between the prongs of the sense contacts 114 and the housing 111. Such a "pillow" 119 may provide additional resiliency to the contacts, in addition to any existing resiliency from the force contacts 112.

Figure 7:
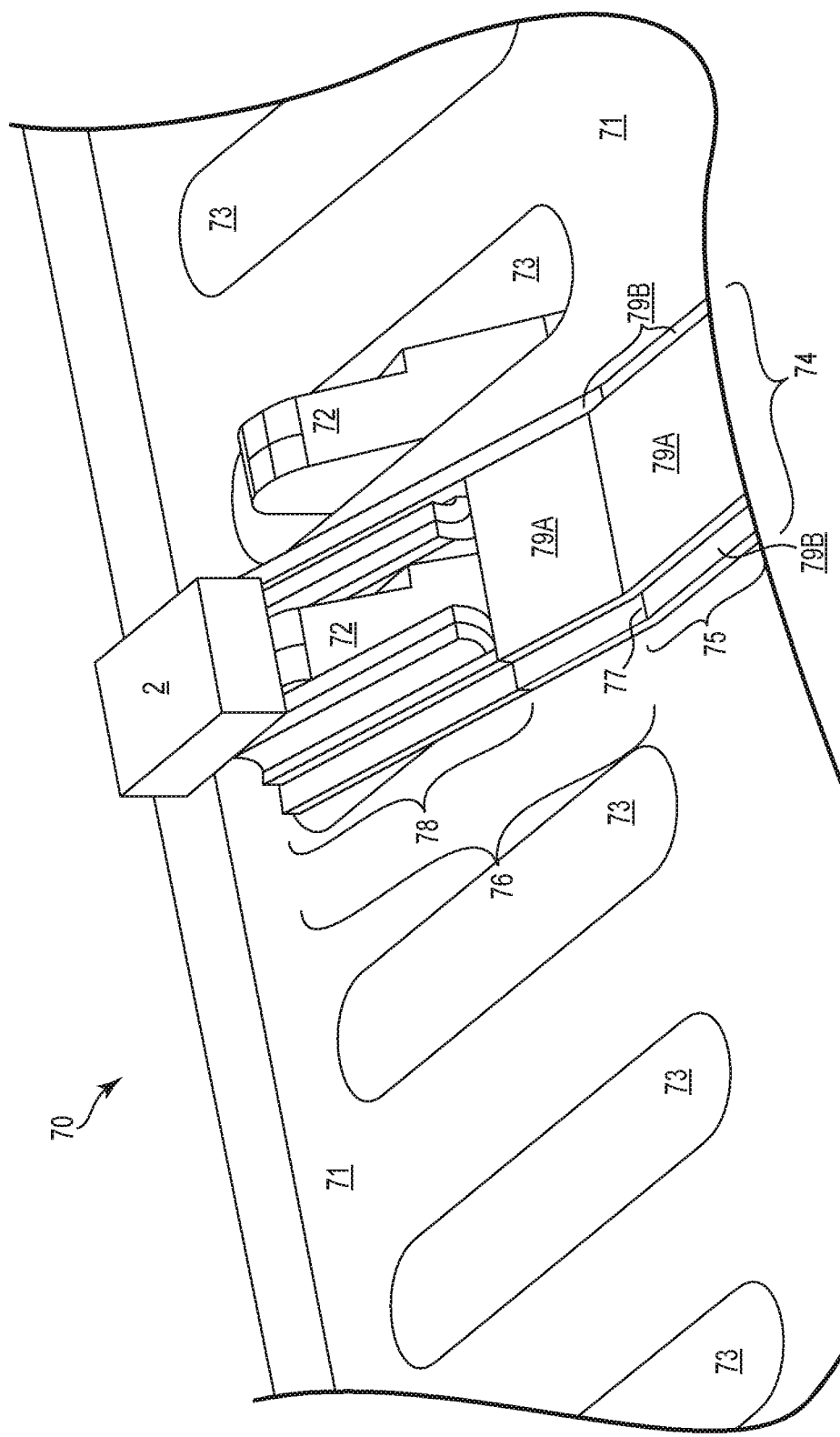
FIG. 7 is a plan drawing of a third design of force and sense contacts on the test equipment.

FIG. 7 shows another forked design, in which the sense contacts are formed as layers, as is done with FIG. 5 above.

For the design 70 of FIG. 7, each sense (voltage) contact 74 has a portion 75 along the membrane or housing 71 which may or may not be fixed and a free portion 76 extending hingedly away from the housing 71. There is a hinged portion 77 that connects the fixed portion 75 to the free portion 76, with the hinged portion 77 being laterally separated from the corresponding force (current) contact 72. The free portion 76 has a forked portion 78 at its distal end that extends on opposite sides of a distal end of the corresponding force contact 72. Note that in FIG. 6 the free portion of contact 64 is longer than in FIG. 7 thus allowing greater flexure and deflection. In other words, by moving the point of fixation farther away from the tip, the flexure is increased, everything else being equal.

When the device under test 1 is forced toward the tester 5, the corresponding terminal 2 on the device under test 1 simultaneously compresses the force contact 72 through the corresponding hole 73 in the housing 71 and compresses the free portion 76 of the sense contact 74 toward the housing 71.

As with the other designs shown herein, each terminal 2 on the device under test 1 makes direct electrical and mechanical contact with a top end of the corresponding force contact 72. The terminal 2 on the device under test 1 also makes direct electrical and mechanical contact with the forked portion 78 of the corresponding sense contact 74. The force contact 72 does not make electrical contact with the sense contact 74, although both may mechanically and electrically contact the terminal 2 on the device under test 1.

As with the design shown in FIG. 5, the fixed portion 75 may be plated onto the housing 71 or free floating and faces the device under test 1. When the sense contacts 74 are formed by such plating, each sense contact 74 is generally planar, includes an electrically conductive layer 79A facing the device under test 1, and includes an electrically insulating layer 79B facing away from the device under test 1.

For the forked design of FIG. 7, each sense contact 74 is generally planar, each forked portion 78 includes two parallel prongs, and each prong includes a raised lip directly adjacent to the corresponding force contact 72 that extends out of the plane of the sense contact 74. The raised or upwardly bent lip (downwardly in the leaded configuration below) may be formed by bending a rectangular portion of the prong out of its plane toward the device under test 1, the plane being defined adjacent portion of the sense contact which may be generally planar For the exemplary design 70 of FIG. 7, along a dimension perpendicular to the forked portion 78 and parallel to the housing 71, the corresponding terminal 2 on the device under test 1 is larger than the corresponding force contact 72. This helps ensure that the device I/O or terminal 2 directly contacts both the force contact 72 and the sense contact 74, because even if there is misalignment between the terminal 2 and the contacts along the dimension cited above, the terminal 2 will directly contact at least one prong of the forked portion 78 of the sense contact 74, in addition to directly contacting the force contact 72.

The design of FIG. 7 may allow for beneficial wiping of oxides from the terminal, as described above with respect to FIG. 5.

Figure 8:
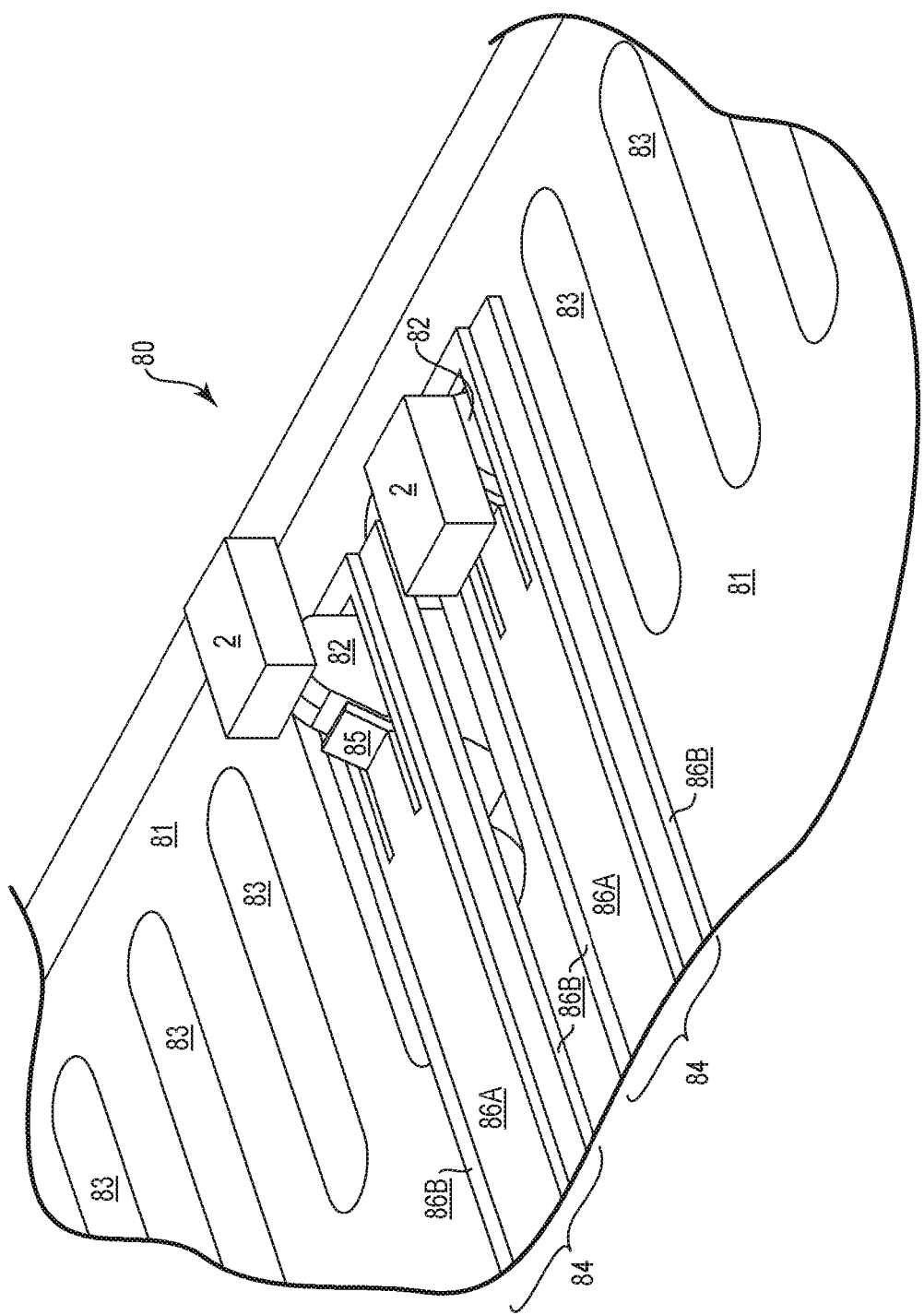
FIG. 8 is a plan drawing of a fourth design of force and sense contacts on the test equipment.

In FIG. 8, as the force (current) contact 82 is compressed over its entire compression range, the sense (voltage) contact 84 remains generally parallel to the housing 81 and can slide or translate laterally along the housing 81. In this design, the sense contact 84 completely laterally surrounds the force contact 82, so that if the force contact 84 translates laterally, the sense contact 84 may follow.

More specifically, the sense contact 84 may translate to follow a lateral cross-section of the force contact 82. Here are some clarifying examples. If the force contact 82 is completely cylindrical (i.e., identical in lateral cross-section at each lateral plane, with each lateral cross-section not necessarily being circular or elliptical), is completely longitudinally oriented, and compressed completely longitudinally, then there is no lateral translation at all of the force contact 82, and the sense contact 84 does not move. If the force contact 82 is cylindrical in shape, but is inclined with respect to the longitudinal direction, and compresses purely longitudinally, then a lateral cross-section of the force contact 82 does translate, and the sense contact 84 would follow such a translation and would laterally translate as well. If the force contact 82 is cylindrical in shape and has a rotational component in its compression, as if there were an off-axis pivot point to its compression, then there would be a lateral component to its compression, with an extent determined by the pivot point location. If the force contact 82 is not a true cylinder in shape, then the sense contact 84 may follows its cross-section through changes in shape, size and/or orientation. For instance, the force contact 82 may have a particular edge that advances or recedes laterally over the longitudinal compression range, and the sense contact 84 may follow that particular edge for all or a portion of the compression range.

This lateral translation of the sense contact 84 may produce the beneficial wiping of oxides off the terminal 2, as described above. For instance, the sense contact 84 may include a particular feature that extends out of the plane of the sense contact 84, such as a prong, a shelf, a ledge, or an arm. This extending feature 85 may act like a blade at the terminal 2, and can help scrape through any oxide layers that are present. It may also act as a guide to help maintain contact 82 in alignment. In the exemplary design 80 of FIG. 8, the sense contact 84 includes an arm bent upwards toward the device under test 1, with the arm being generally parallel to the adjacent face of the force contact 82. Other suitable orientations are possible, as well.

In most cases, the lateral translation of the force contact lateral cross-section, over the range of longitudinal compression, is less than the size of the terminal 2 on the device under test 1, so that the force contact 82 does not "fall off" the device I/O or terminal 2 during use.

In the exemplary design 80 of FIG. 8, the sense contact 84 extends completely laterally around the force contact 82. Alternatively, there may be one or more gaps in the sense contact 84, so that it extends only partially around the force contact 82. For instance, there may be a gap along one or more sides, so that the sense contact 84 may still "catch" the force contact 82 to translate laterally. In some cases, the sense contact 84 includes a partial or complete fork-like structure around the force contact 82, and a partial or complete portion perpendicular to the fork prong that can engage one or both of the opposing sides of the force contact 82 over its range of compression.

Figure 9:
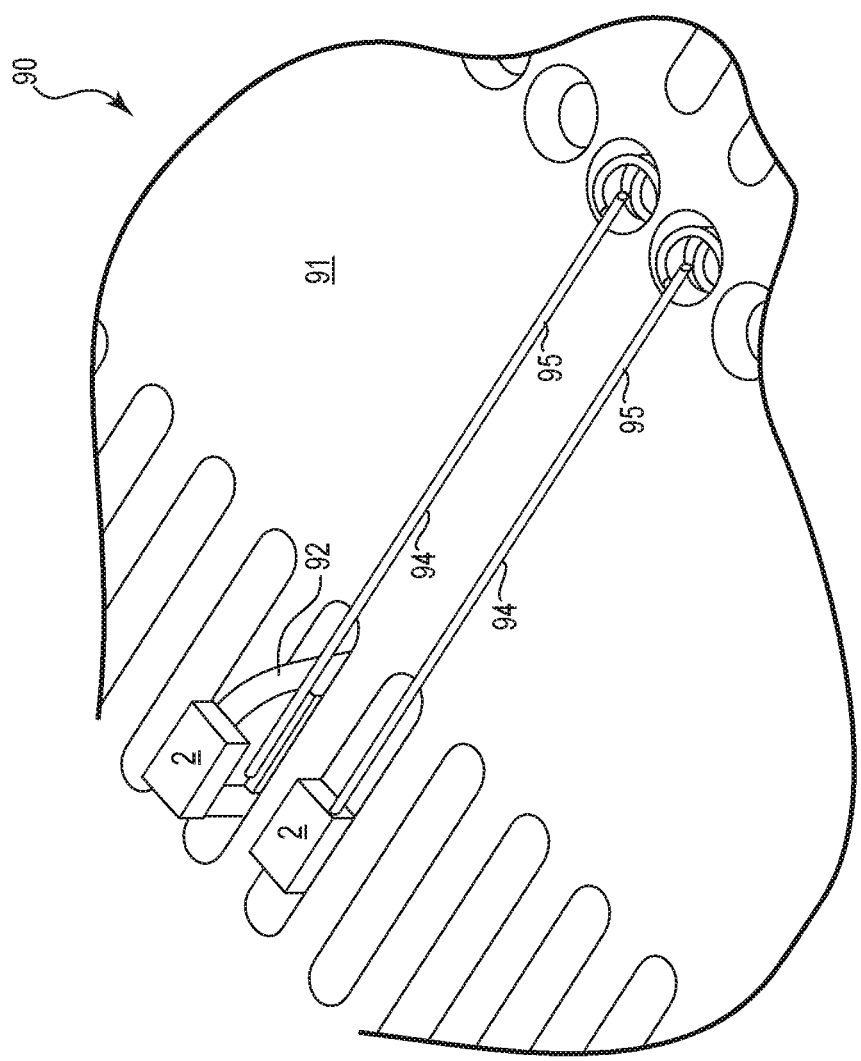
FIG. 9 is a plan drawing of a fifth design of force and sense contacts on the test equipment.

FIG. 9 shows a contact design 90 similar to that of FIG. 5, but using a relatively rigid rod 95 as the sense (voltage) contact 94. The force (current) contact 92 has a notch that accommodates an end of the sense contact rod 95, so that the terminal 2 on the device under test 1 can directly contact both the force contact 92 and the sense contact 94 independently. An optional electrically insulating coating on the sense contact 94 and/or the force contact 92 may help prevent the two contacts from shorting.

The rod 95 extends laterally away from the force contact 92, along the side of the housing 91 facing the device under test 1, then passes through a hole in the housing 91, exits the housing 91, and contacts a respective contact pad 4 on the load board 3. Note that any or all sections of the rod 95 may straight, may have some periodic or irregular curvature, and/or may be coiled.

For the exemplary rod 95 shown in FIG. 9, the rod 95 does not significantly wipe through any oxide layers on the terminal.

Figure 10:
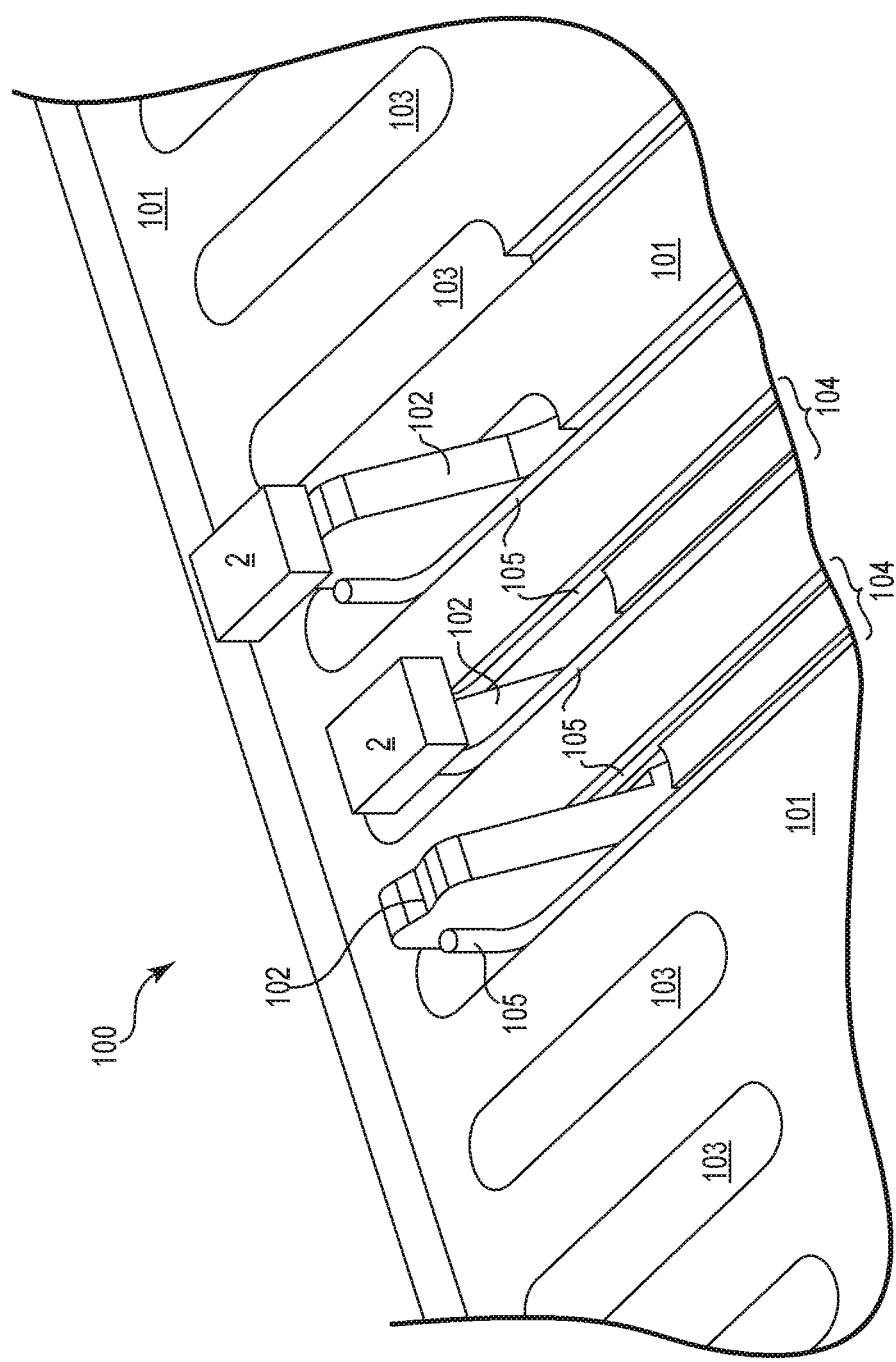
FIG. 10 is a plan drawing of a sixth design of force and sense contacts on the test equipment.

A variant of the single rod of FIG. 9 is a dual-rod, shown in FIG. 10.

In the design 100 of FIG. 10, the sense (voltage) contact 104 includes two rods 105, one on either side of the force (current) contact 102, that extend laterally away from the force contact 102 along the top side of the housing 101. The rods 105 may join together at a point to form a forked portion, analogous to the forked structures shown above. Alternatively, the rods 105 may remain separate as they extend across the housing 101. The rods 105 may pass through the housing 101 joined, through a single hole in the housing 101, or separately, through individual holes in the housing 101. Like many of the designs shown above, having two sense contacts 104 on each side of the force contact 102 adds redundancy in case of misalignment and also acts as a self-aligning tool to center the force contact 102 on the device I/O or terminal 2. Rods 105 preferably have a linear (straight) portion and then a curved or angled portion extending generally orthogonally to the straight portion.

In some cases, the rod or rods 105 may be sunk into a corresponding channel or channels in the housing 101. Such channels may protect the rods 105 from damage. Additionally, the channels may help attach the rods 105 to the housing 101 or help in positioning rods in close proximity to force contacts 102. In addition, because the rods 105 may be electrically conductive, the housing 101 may be made from an electrical insulator and may help electrically isolate each rod 105 from the other rods 105 and from other elements in proximity to the rods 105. Also, the rods 105 may be coated with an electrically insulating material to prevent shorting to their respective force contacts 102. A variety of materials may be used, including parylene, Teflon®, Peek®, Kapton®, and so forth.

In some cases, each rod 105 has a distal end that bends out of the plane of the housing 101 toward the device under test 1. Such a bent distal end may improve electrical contact with the terminal 2 on the device under test 1. Such a bent distal end may also localize the electrical contact to the region near the bend, so that away from the bend, each rod 105 is electrically insulated by the surrounding channel in which it resides.

In some cases, there is a pair of rods 105 associated with each force contact 102, with the pair of rods 105 being disposed on opposite sides of the force contact 102. The rods 105 have distal ends, optionally bent out of the plane of the housing 101 toward the device under test 1, that straddle the force contact 102. The rods 105 then extend away from the force contact 102 in the same direction along the housing 101, optionally within parallel channels in the housing 101. These parallel channels may optionally be formed in a separate alignment plate that mounts to the housing 101. The distal ends may also point toward a point of convergence.

Along a dimension perpendicular to the rods 105 and parallel to the housing 101, the corresponding terminal 2 on the device under test 1 is larger than the corresponding force contact 102. In general, when the device under test 1 is forced toward the housing 101, the corresponding terminal 2 on the device under test 1 simultaneously compresses the force contact 102 through the corresponding hole 103 in the housing 101 and contacts the distal end of at least one conductive rod 105 of the corresponding sense contact 104.

In some cases, the rods 105 are directly adjacent to the force contact 102. The rods may help hold the force contact 102 in place during use and may help prevent wobbling, which is beneficial.

In some cases, each rod 105 is an elongated cylinder, optionally with a circular cross-section. In other cases, each rod 105 may have a rectangular or square cross-section. In some cases, each rod 105 may be formed separate from the housing 101, then attached to the housing 101 or held in place by an alignment plate, which may be mounted on top of the housing 101. In other cases, each rod 105 may be made integrally with the housing 101, such as by plating onto the surface of the housing 101 or into a channel in the housing 101.

FIG. 13 is side-view cross-sectional drawing of a design 130, showing a sample geometry of a sense (voltage) contact 134 in its path from the terminal 2 on the device under test to the contact pad 4 on the load board 3 which has a plurality of apertures 142 of predetermined gap therein.

The contact 134 extends laterally away from the terminal 2 along a face of the housing 131, bends roughly 90 degrees (orthogonal) to extend through a hole in the housing 131, (portion 134*b*) and bends (portion 134*c*) generally equal to or preferably slightly less than 90 degrees to lie roughly parallel to the opposing face of the housing 131 through aperture 142. This generally equal to or preferably less than 90 degree bend provides some bias force to the load board pad 4 assuring a solid connection. When contacting the electrical contact pad 4 on the load board 3, a portion of the contact 134 is longitudinally disposed between the contact pad 4 and the housing 131. Aperture 142 is sized to be greater than the thickness of the portion of the contact passing there through. In the preferred embodiment, the aperture is rectangular or the same shape as the contact passing through, and the gap created between the contact portion 134*b* and the walls of the aperture should be sufficiently great a turning force (lever action) can be transmitted from the force applied on contact 134c/d by pad 4 (or 2) to contact 134 on pad 2 (or 4). Thus, the gap is wide enough to control the position of the contact through the aperture but still transmit such force. Typically an aperture of twice or three times the thickness of the contact portion will suffice.

Note also that the cross-sectional view may apply to any of the designs shown above in which the sense contact is generally planar (FIGS. 5-8 and 11), or is generally a rod (FIG. 9-10). In those cases where the sense contact is a self-supporting electrically conducting substrate, such as wire, or a metallic sheet, the substrate may be bent according to the geometry of FIG. 13. In those cases where the sense contact is coated or plated onto an electrically insulating substrate, the insulating substrate may be bent according to the geometry of FIG. 13.

In the specific design 130 of FIG. 13, both ends of the contact 134, are bent toward the terminal 2 on the device under test. There are alternatives to this geometry.

For instance, FIG. 14 shows a design 140 similar to design 130, in which the contact 144 extends laterally away from the terminal 2 along a face of the housing 141, bends 90 degrees (portion 134b) to pass through a hole 142 in the housing 141, and bends (portion 134d) roughly equal to or preferably slightly less than 90 degrees to lie roughly parallel to the opposing face of the housing 141. This generally equal to or preferably less than 90 degree bend provides some bias force to the load board pad 4 assuring a solid connection. In contrast with the design 130 of FIG. 13, the design 140 of FIG. 14 has opposite ends of the contact 144 extending in opposite directions, rather than both ends extending toward the terminal 2

There may be potential advantages to the design 140 of FIG. 14, rather than that 130 of FIG. 13. For instance, the contact itself 144 may be easier to fabricate and assemble. In some cases, such a contact 144 may be easier to bend than the corresponding contact 134. In some cases, the geometry of FIG. 14 may force the push pin into place (see turning forces above), thereby securing the assembled parts. In some cases, with the geometry of FIG. 14, the torques generated by the terminal 2 or 4, with respect to the hole in the housing 141, may force the end of the contact 144 into contact with the contact pad 4 or 2 on the load board 3, which may be desirable. This provides a bias pushing the sense contact towards the device under test and makes it easier to align terminal 2 with sense contact 141.

The term "roughly parallel", as used above, denotes that the 90 degree bend in the contact 134 and 144 directly adjacent to the contact pad 4 may actually be less than 90 degrees. For instance, the bend may be in the ranges of 70-90 degrees, 75-90 degrees, 80-90 degrees, 85-90 degrees, 70-85 degrees, 75-90 degrees, 70-80 degrees, 75-85 degrees, 80-90 degrees, 70-75 degrees, 75-80 degrees, 80-85 degrees, and/or 85-90 degrees. In some cases, the bend angle may be 80 degrees.

Note that there may optionally be a radius to any or all of the bends in the contact 134 and 144, rather than sharp angles, as drawn in FIGS. 13 and 14. Such radii may simplify the manufacturability of the contact 134 and 144.

Up to this point, the sense (voltage) contact has been shown generally as a rod or set of prongs extending upward to the terminal 2 on the device under test 1. The ends of the sense contact may optionally have some structure to them, which in some cases may assist with the wiping function described above. Some examples are shown in FIGS. 15-20.

FIG. 15 is a side-view schematic drawing of a pair of straddling sense contacts 154 having tips 155 that are angled away from the central force (current) contact 152. The angling may be confined to within the plane of the page, or may optionally extend out of or into the plane of the page.

Figure 16:
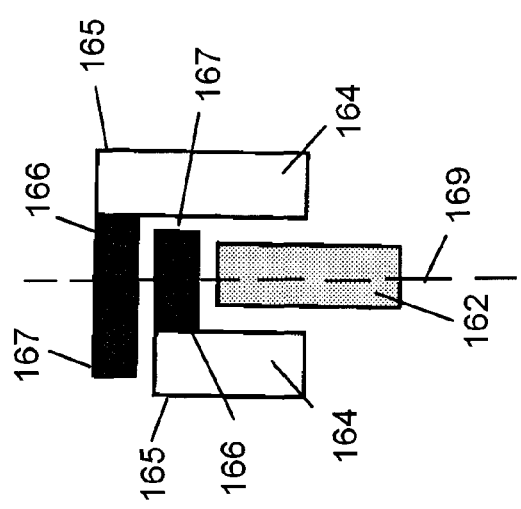
FIG. 16 is a top-view schematic drawing of a pair of sense contacts that, at their distal ends, include laterally-extending portions that extend toward each other.

FIG. 16 is a top-view schematic drawing of a pair of sense contacts 164 that, at their distal ends 165, include laterally-extending portions 166 that extend toward each other converging to a distant point. The sense contacts 164, including their laterally-extending portions 166, surround the central force contact 162.

In addition, the laterally-extending portions 166 extend out of the plane of the page, toward the terminal 2 on the device under test 1 (not shown). In the view of FIG. 16, the terminal 2 would reside between the plane of the page and the viewer. The tips 167 of the laterally extending portions 166 would be closer to the viewer than the rest of the contacts 164. Notice that the contacts 166, 167 extend generally orthogonally away from arms 165 so that they are parallel to each other and would be intersected by a longitudinal axis 169 drawn through contact 162.

Figure 17:
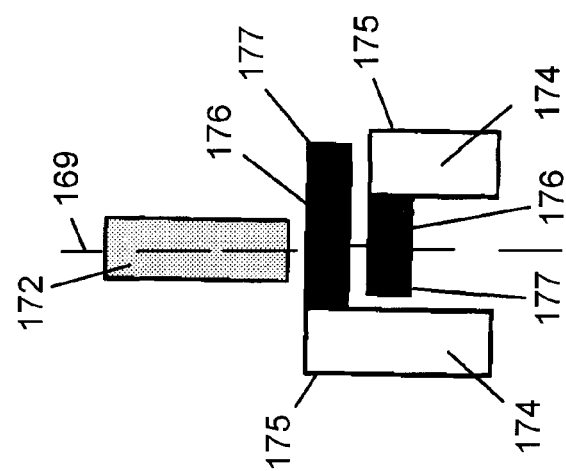
FIG. 17 is a top-view schematic drawing of a pair of sense contacts that, at their distal ends, include laterally-extending portions that extend toward each other.

FIG. 17 is a top-view schematic drawing of a pair of sense contacts 174 that, at their distal ends 175, include laterally-extending portions 176 that extend toward each other and generally orthogonal to their arms 174. The sense contacts 174, including their laterally-extending portions 176, do not surround the central force contact 172 but would be intersected by a longitudinal axis 169 passing through 172. One may think of the central force contact 172 as being "outside" a polygon formed by the pair of sense contacts 174 and their laterally extending portions 176.

As with FIG. 16, the laterally-extending portions 176 extend out of the plane of the page, the terminal would reside between the plane of the page and the viewer, and the tips 177 of the laterally extending portions 176 would be closer to the viewer than the rest of the contacts 174.

Figure 21:
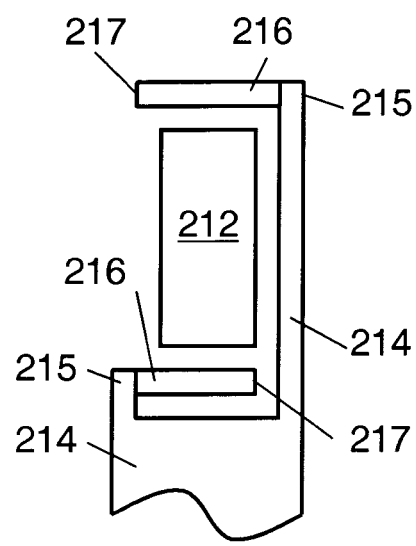
FIG. 21 is a top-view schematic drawing of a pair of sense contacts that, at their distal ends, include laterally-extending portions that extend up out of the page.

FIG. 21 is a top-view schematic drawing of a pair of sense contacts 214 that, at their distal ends 215, include laterally-extending portions 216 that extend toward each other. The sense contacts 214, including their generally orthogonal laterally-extending portions 216, surround the central force contact 212, which protrudes through the gap between contacts 214 and 215. The tips 217 of the laterally extending portions 216 would be closer to the viewer than the rest of the contacts 214. Here, the laterally extending portions 216 lie on opposite sides of the force contact 212.

Figure 18:
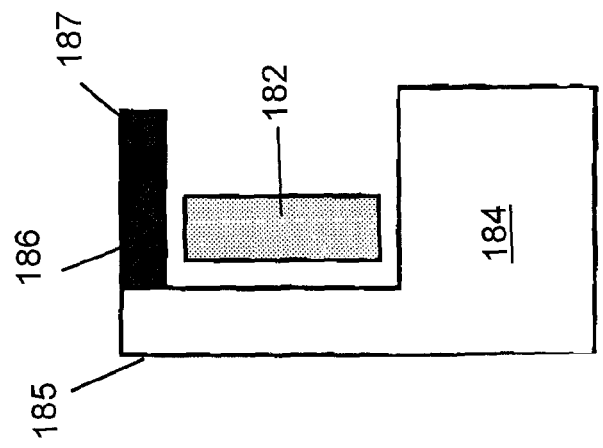
FIG. 18 is a top-view schematic drawing of a single sense contact that, at its distal end, includes a laterally-extending portion that extends partway around the force contact.

FIG. 18 is a top-view schematic drawing of a single sense contact 184 that, at its distal end 185, includes a laterally-extending portion 186 that extends partway around the force contact 182. As with FIGS. 16 and 17, the laterally-extending portion 186 extends out of the plane of the page, the terminal would reside between the plane of the page and the viewer, and the tip 187 of the laterally extending portion 186 would be closer to the viewer than the rest of the contact 184.

Figure 19:
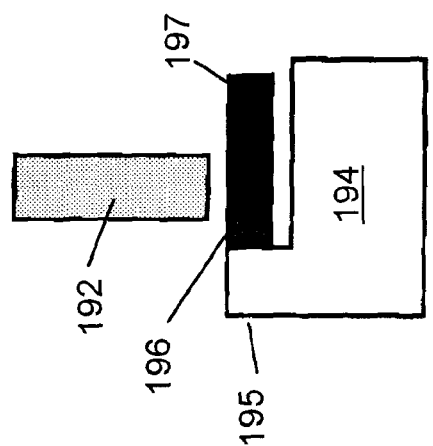
FIG. 19 is a top-view schematic drawing of a single sense contact that, at its distal end, includes a laterally-extending portion that does not extend partway around the force contact.

FIG. 19 is a top-view schematic drawing of a single sense contact 194 that, at its distal end 195, includes a laterally-extending portion 196 that does not extend partway around the force contact 192. The laterally extending portion 196 is on the opposite side of the force contact 192 as the laterally extending portion 186 shown in FIG. 18. As with FIGS. 16-18, the laterally-extending portion 196 extends out of the plane of the page, the terminal would reside between the plane of the page and the viewer, and the tip 197 of the laterally extending portion 196 would be closer to the viewer than the rest of the contact 194.

Figure 20:
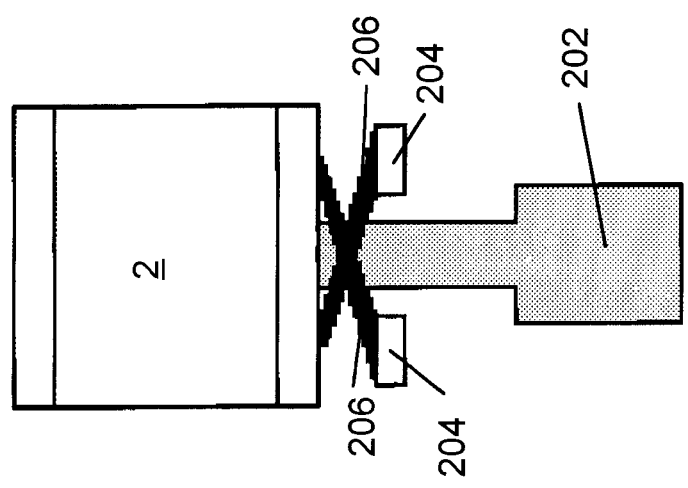
FIG. 20 is a side-view schematic drawing of a pair of sense contacts having tips that are angled toward each other and cross each other over or alongside the central force contact.

FIG. 20 is a side-view schematic drawing of a pair of sense contacts 204 having tips 206 that are angled toward each other and cross each other over or alongside the central force contact 202. The tabs or tips 206 can cross the force contact 202 behind or in front of the force contact 202. During contact with the terminal 2 on the device under test, the terminal pushes downward on the tips 206, forcing them away from each other, creating a scrubbing action to break through oxide layer on terminal 2. Elimination of oxides is an important outcome in this embodiment. The angling may be confined to within the plane of the page, or may optionally extend out of or into the plane of the page. The cross over arms may have a non-conductive coating at least on their back side to prevent shorting to the contact 202 or contact 202 may just be formed so that it cannot contact tips 206.

In general, the sense contacts may have tips or tabs that may extend out of the plane of the membrane, toward the terminal on the device under test. When contacting the terminal, the tabs may bend or flex independently of the motion or orientation of the rest of the sense contacts. This motion may be a bending motion, such as with a generally flexible material, and may optionally include a hinged structure at the proximal end of the tab that joins it to the rest of the sense contact. The tabs may optionally extend laterally toward, across or around the force contact. In some cases, there is a single sense contact that has a tip that extends laterally past the force contact, so that the force contact is partially "inside" or partially "outside" the confines of the sense contact. In other cases, there are two sense contacts that are generally parallel to each other, with tips that extend toward each other, so that the force contact is partially "inside" or partially "outside" the confines of the two sense contacts. Alternatively, the tips may extend laterally away from each other, or may extend in any general lateral direction, in addition to extending out of the plane toward the terminal on the device under test.

Although the force (current) contact is typically thicker than the sense (voltage) contact, and the above description has assumed such, it should be noted that the functions of the two contacts may be reversed, so that the thinner contact carries the current and the thicker contact measures the voltage. The preferred application of this would be to make the contact in housing slot thinner and make the contact on top of housing thicker to handle more current.

In addition to ball grid array (BGA) and other leadless packages with pads on the underside of device, the present construction may also be applied to components in particular integrated circuits with leads or wires, known as leaded-contact packages.

FIGS. 22-32 illustrate Kelvin contacts for leaded packages. To the extent that elements for BGA packages or packages with pads on the underside of device are similar, they will have the same part number increased by 500. Therefore, contacts 2 in BGA appear as contacts 502 in leaded, and so forth.

Figure 22:
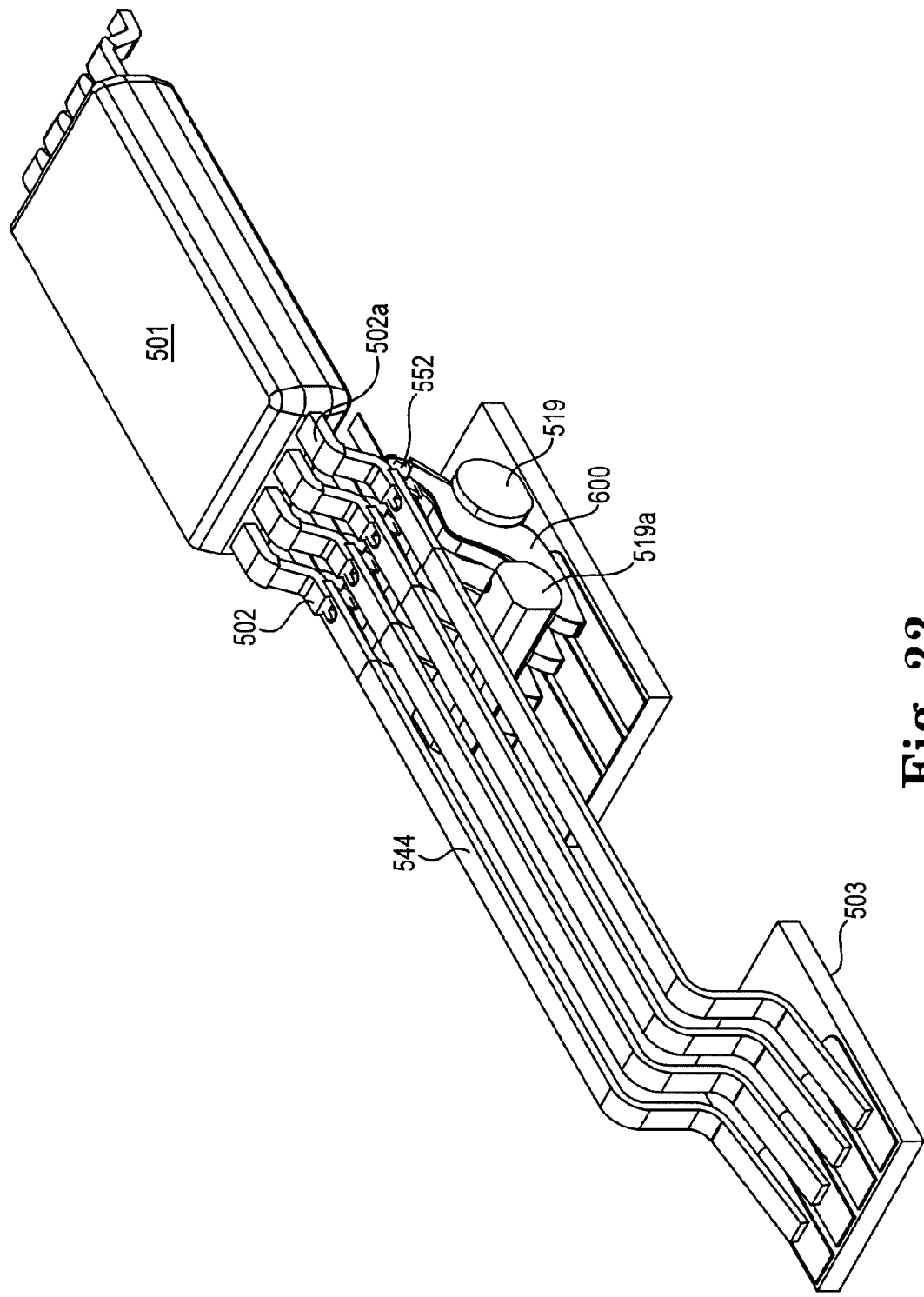
FIG. 22 is a perspective schematic view of a leaded integrated circuit package and the Kelvin contact system therefore.
Figure 23:
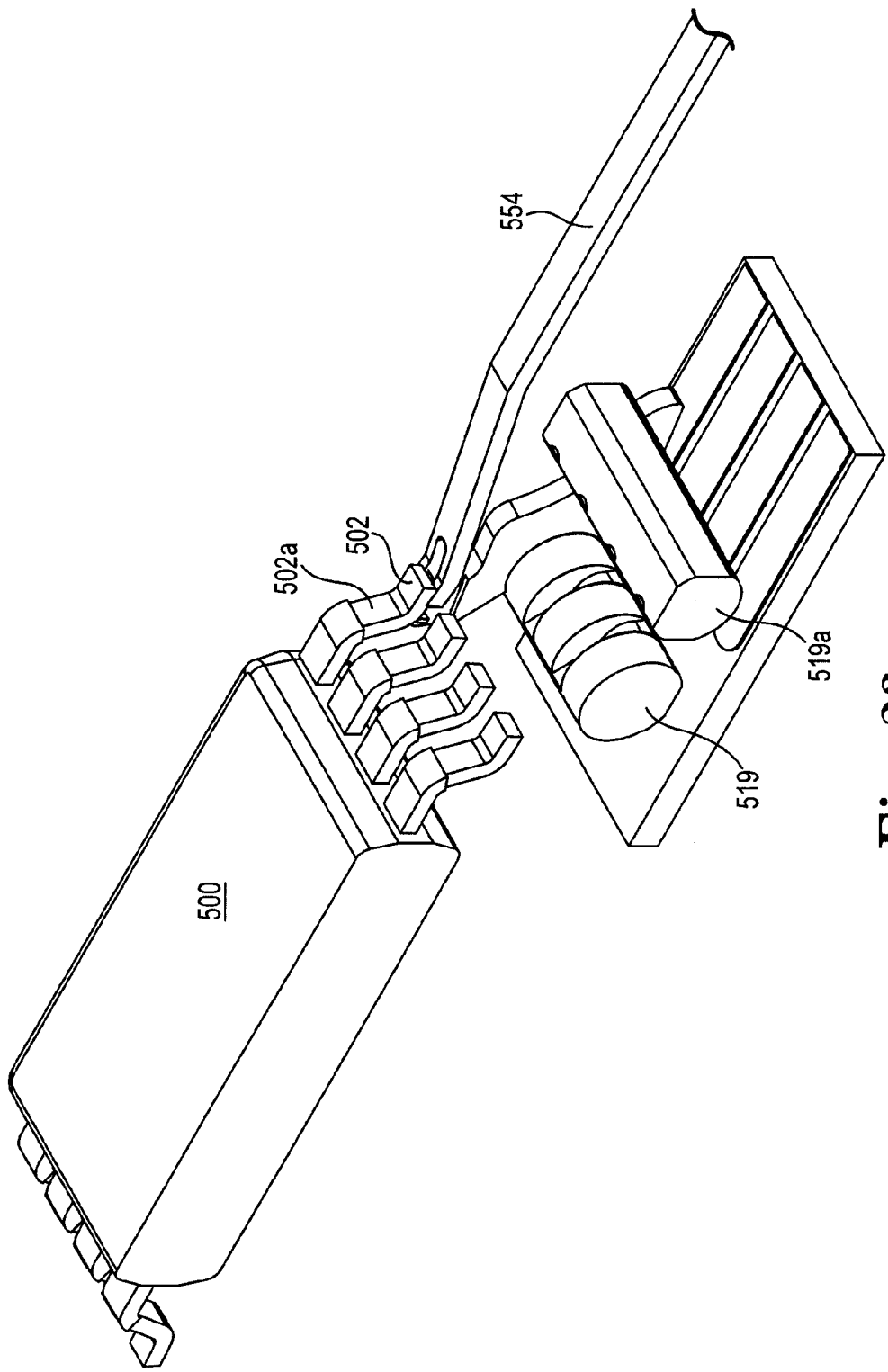
FIG. 23 is a close up perspective of the system of FIG. 22 with portions removed for clarity.
Figure 24:
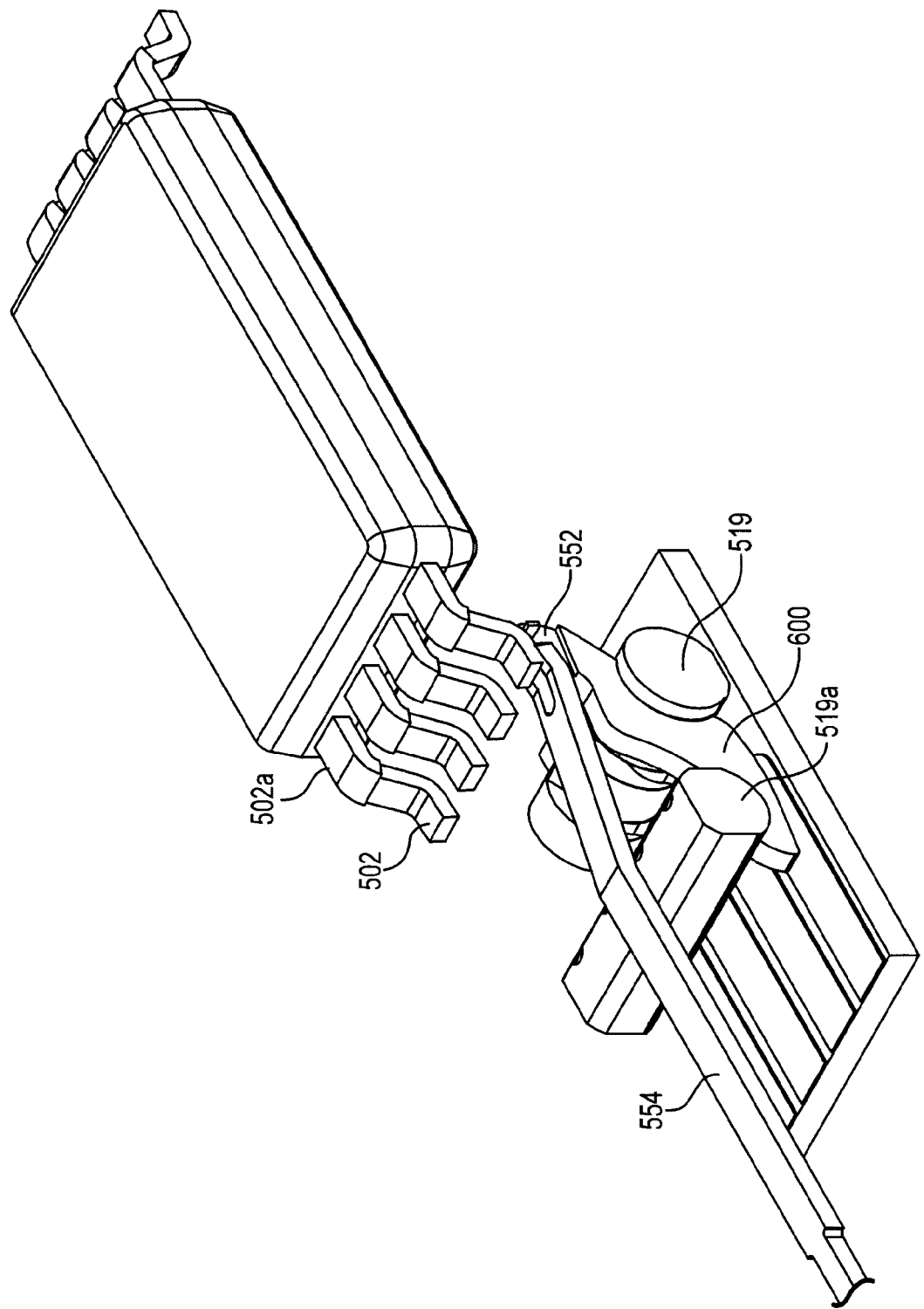
FIG. 24, is a view like FIG. 23 but taken from the other side.
Figure 25:
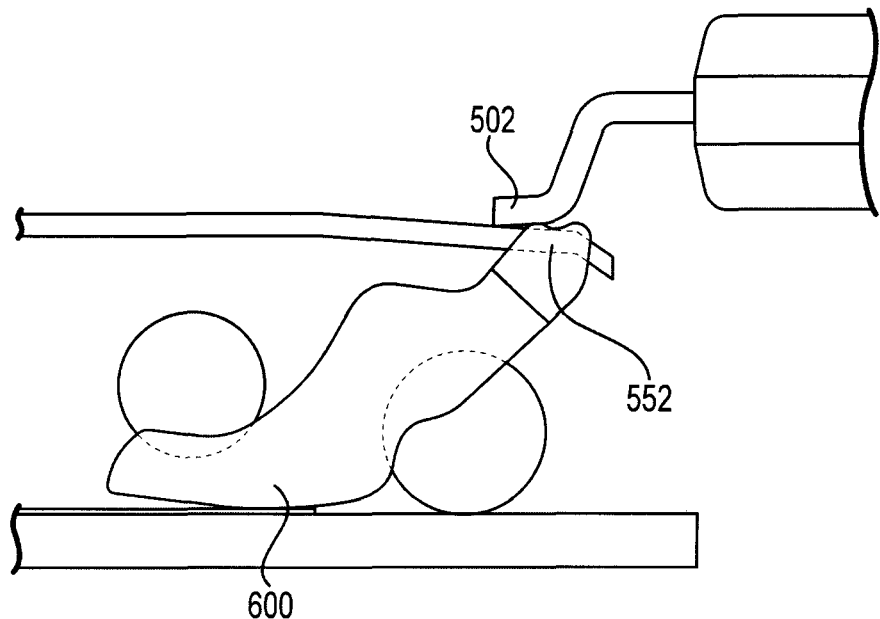
FIG. 25 is a side schematic view of the system applied to a leaded device in an compressed state.
Figure 26:
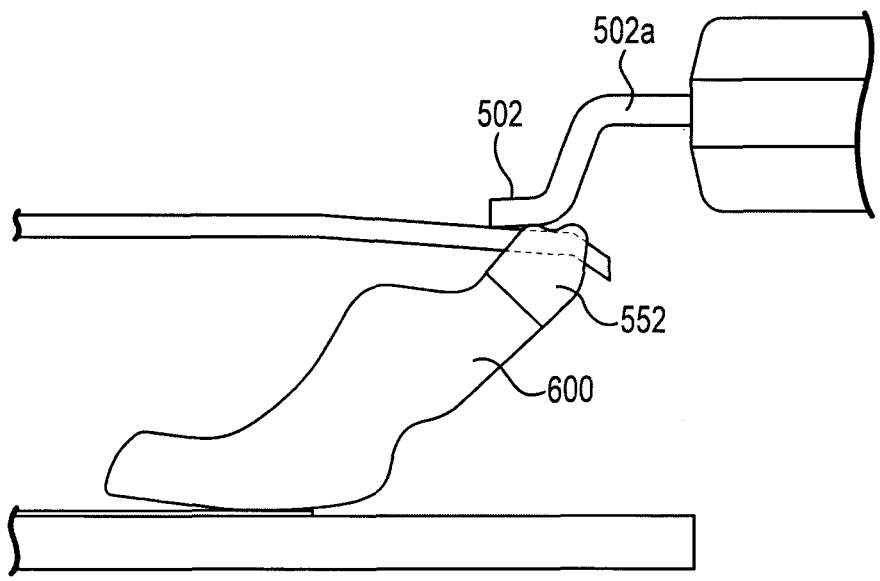
FIG. 26 is a view like FIG. 25 except with the elastomeric portions removed.

FIGS. 22, 22. 23, and 24 shows a leaded device (DUT) 501 with a plurality of leads 502a each having contacts 502. As in the case of pad packages, a force contact 552 makes contact with a lead 502, usually in a central portion thereof. Contact 552 is upwardly biased by element 519 similar to pillow 119 (FIG. 11) but preferably cylindrical. (Note that the cylindrical form may also be used in pad or BGA constructions.) A second bias block 519a is used to apply a downward force on the rocking pin 600. Rocking pin 600 is similar to that shown in U.S. Pat. Nos. 5,069,629 and 7,445,465 and is hereby incorporated by reference.

Contact extensions 544 are formed as shown in FIG. 22 so that they follow a path to a load board 503, where they make electrical contact. The extension provides easier load board layout and facilitates easier trace routing on the load board. The sense contact tips in FIG. 22 have a dual tine fork design. In this case the fork tip are flat horizontally with no upward curvature like in FIG. 6. This allows the terminal lead edge of the device under test to wipe along the top surface of the fork and remove oxides.

Figure 27:
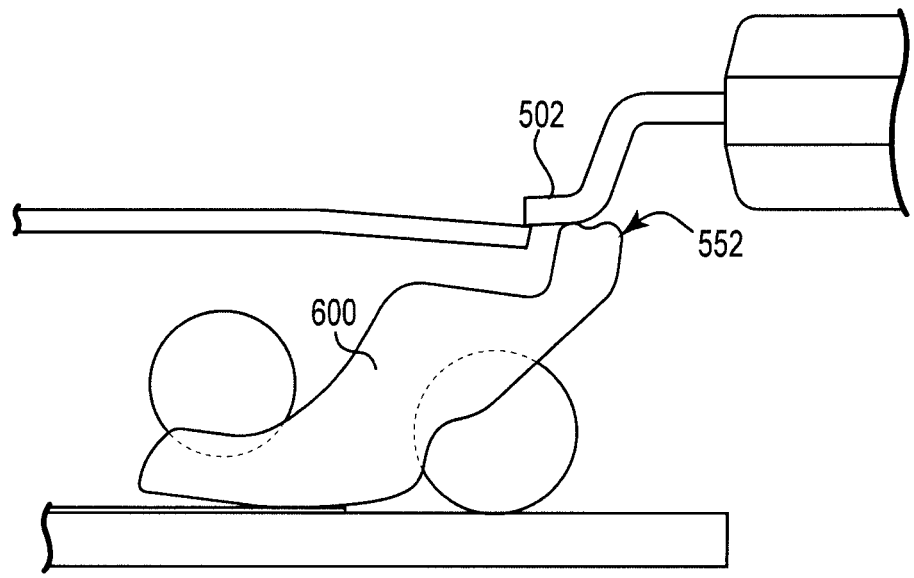
FIG. 27 is a view like FIG. 25 except with a compressed state and sense contact designed to hit only front portion of lead protruding from device.
Figure 28:
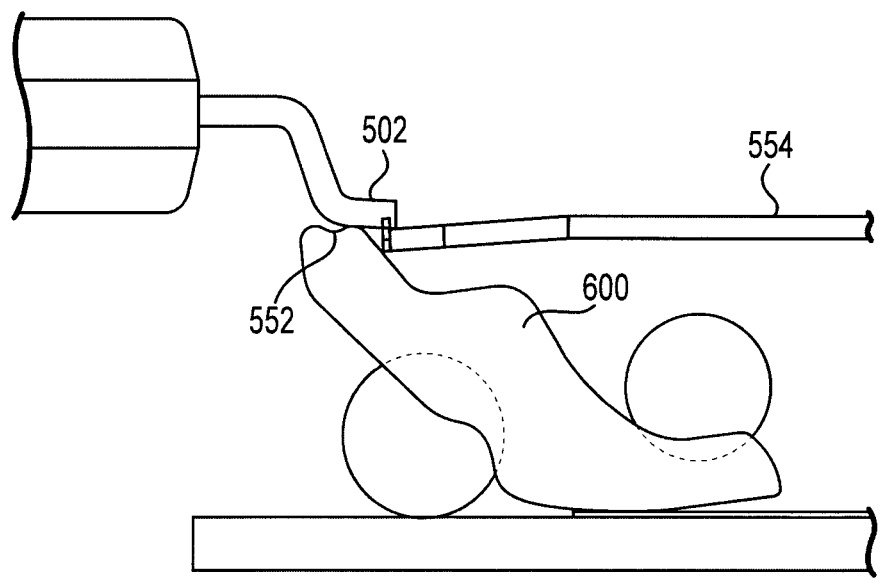
FIG. 28 is a view like FIG. 27 except taken from the other side and approach has a tines (finger) bent upward to initialize contact with the device sooner to provide more compliance.
Figure 29:
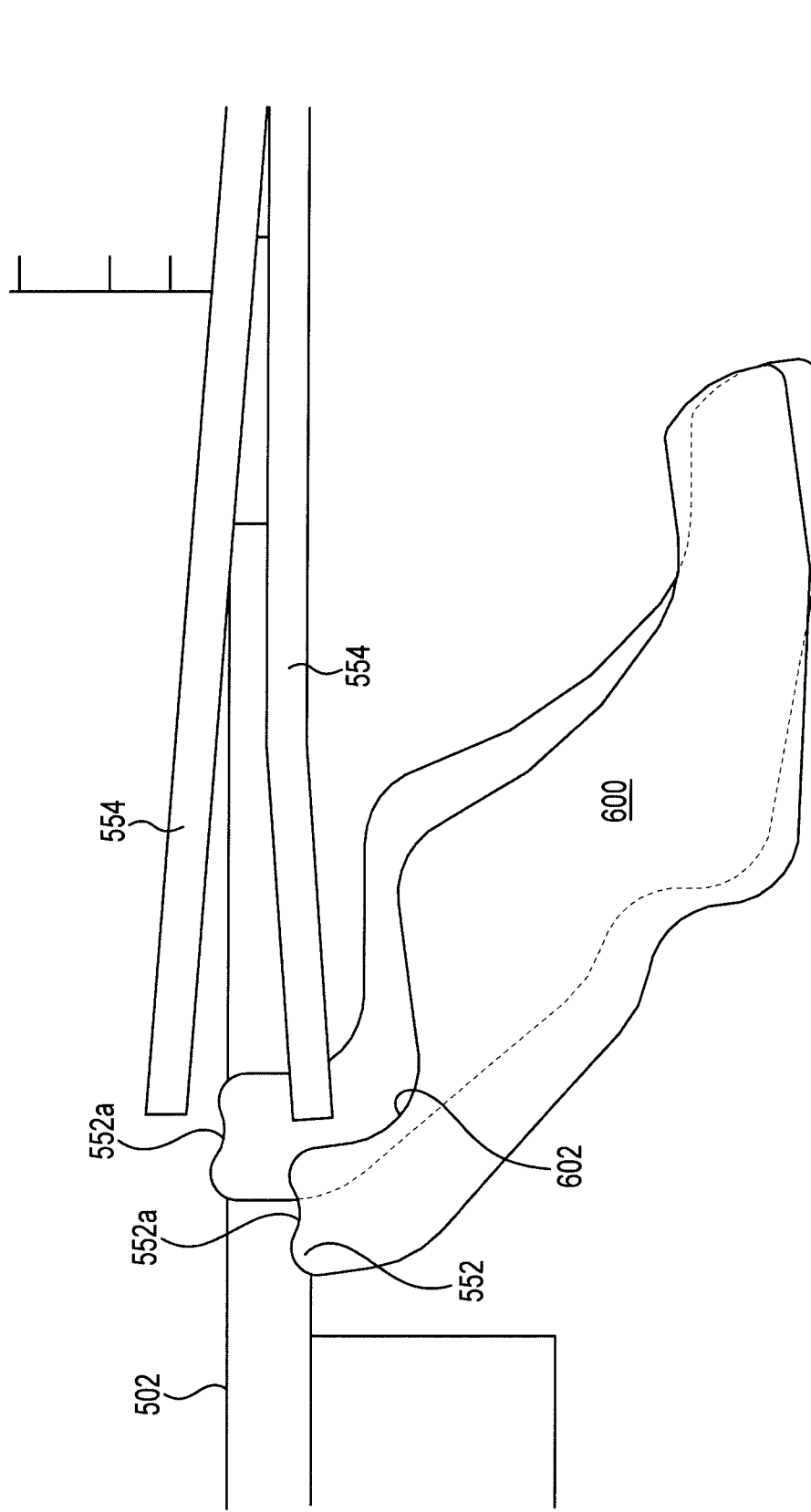
FIG. 29 is a schematic view showing both uncompressed and compressed states simultaneously of concept that only connects the from portion of the device lead.
Figure 30:
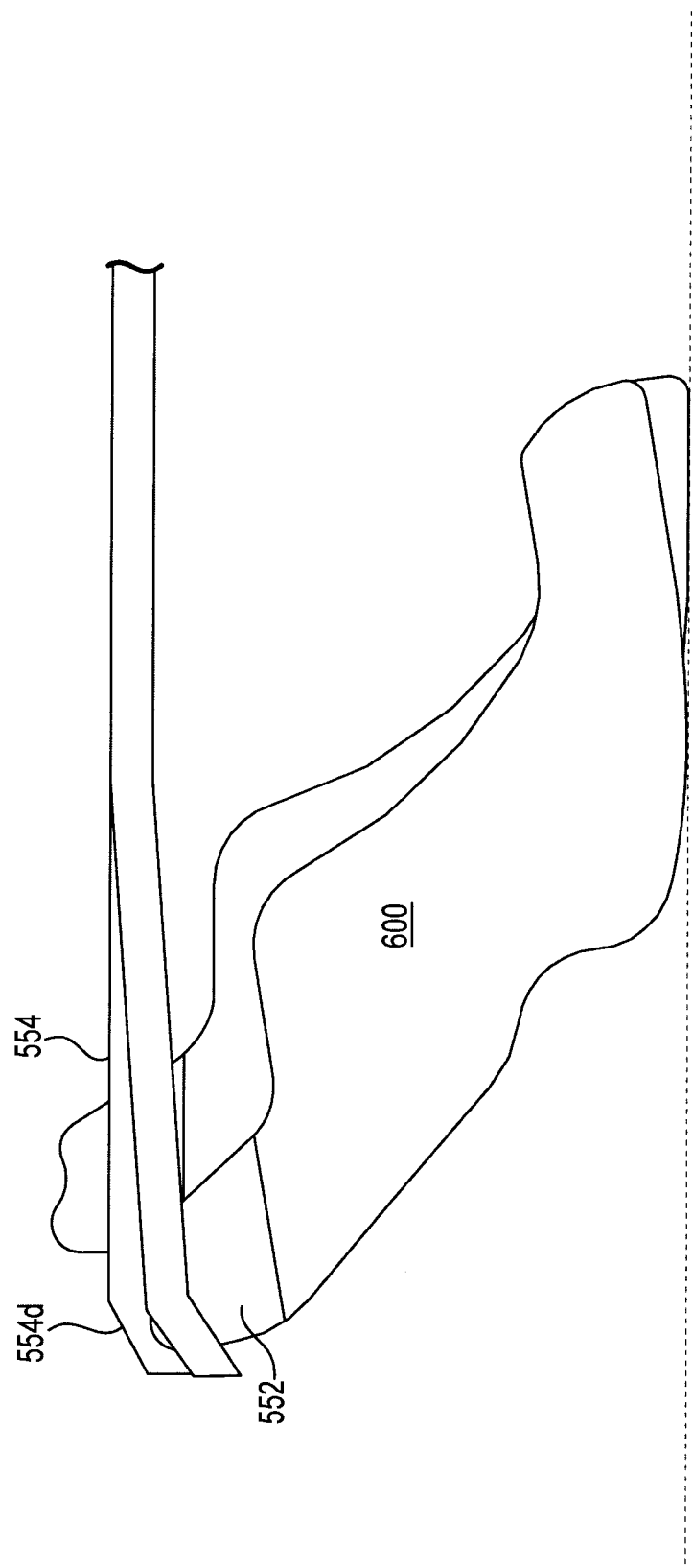
FIG. 30 is a view like FIG. 29, showing uncompressed and compressed states simultaneously with dual tine concept where sense fork tines straddle force contact.
Figure 31:
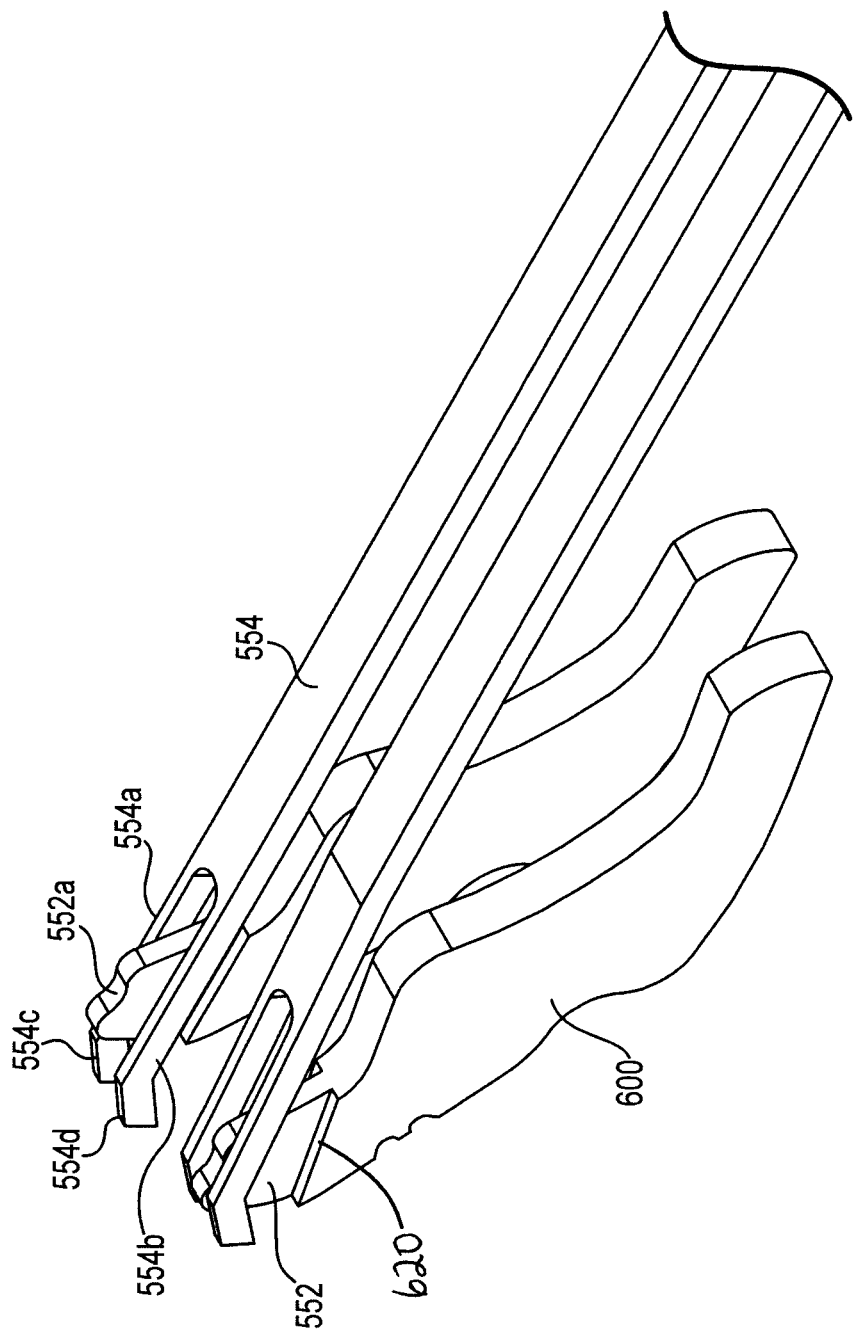
FIG. 31 is a perspective view showing a forked sense lead straddling a reduced tip thickness force contact.
Figure 32:
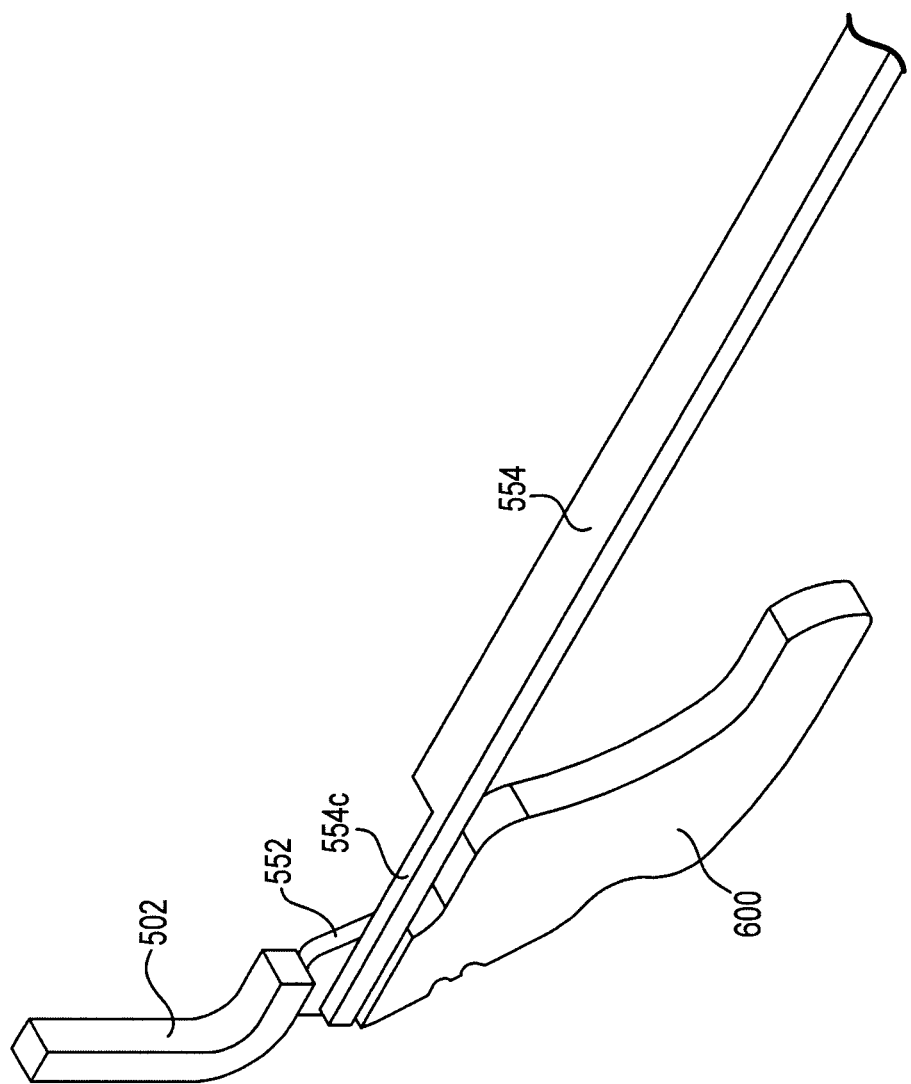
FIG. 32 is a perspective view like FIG. 31 showing a single sided sense lead and a force contact with an offset.

FIGS. 25, 26, 27, 28, 29, 30, 31, and 32 provide greater detail as to how the force 552 and sense contacts 554 function for three different concepts. Force Contact in FIGS. 27, 28, and 29 has a full width force contact 600. Force contact in FIGS. 25, 26, 30, 31, and 32 have a tip 552 that is reduced in thickness to prevent shorting to sense contact 554 and to provide a more knife edge (ie tip narrower than the base) to penetrate oxide layers on devices under test leads. In FIG. 31, a ledge 620 is shown which is a portion where the tip 552 is narrowed. FIG. 27 shows an alternate approach to FIG. 26 in that the end of sense contact 554 is raise out of the page similar to concept shown in FIGS. 20 and 21. First the force contact tip 552 preferably has a "toothlike crown" with a dip or recess 552a. The sense contacts 554 in FIGS. 25, 26, 30, and 31 have a forked end terminating in two tines 554a and 554b, which, at their distal ends have tines which are angled downwardly (opposite of pad package tines 554a) at 20-30 degrees (ie 20, 21 . . . or 30 degrees) off the plane of contact 554. FIG. 32 shows an alternate approach to dual tine approach in that the force contact tip 552 is offset to one side and sense contact 554 has only one tine. The gap between the force contact tip and sense tine is centered on device lead centerline to assure adequate contact. The distal end of contact 554 may be chamfered or rounded on its lower surface to provide additional clearance. The inner periphery 602 of the force contact 600 is cut away (i.e. the thickness front to back is reduced) to insure clearance with sense contact 554 as it moves.

In operation, contact 600 "rocks" from the two positions shown in FIG. 29 in response to contact with leaded contact 502. Likewise the sense contact 554 moves between the two positions shown. The movement of the various components in FIG. 30 is the same as FIG. 29 except that FIG. 30 shows sense contacts with downwardly angled tines and reduce tip width contact 600. Note that the tines need not be downwardly angled to function.

FIG. 32 shows a variation on the dual tine construction of FIG. 31. In this case the sense contact 554 has only a single tine 554a which may or may not have a downwardly angled portion (such as shown in FIG. 31). This allows for the force contact to have a greater contact surface area if desired. In this design the force contact tip is offset and not centered on the contact 600 width.

Figure 33:
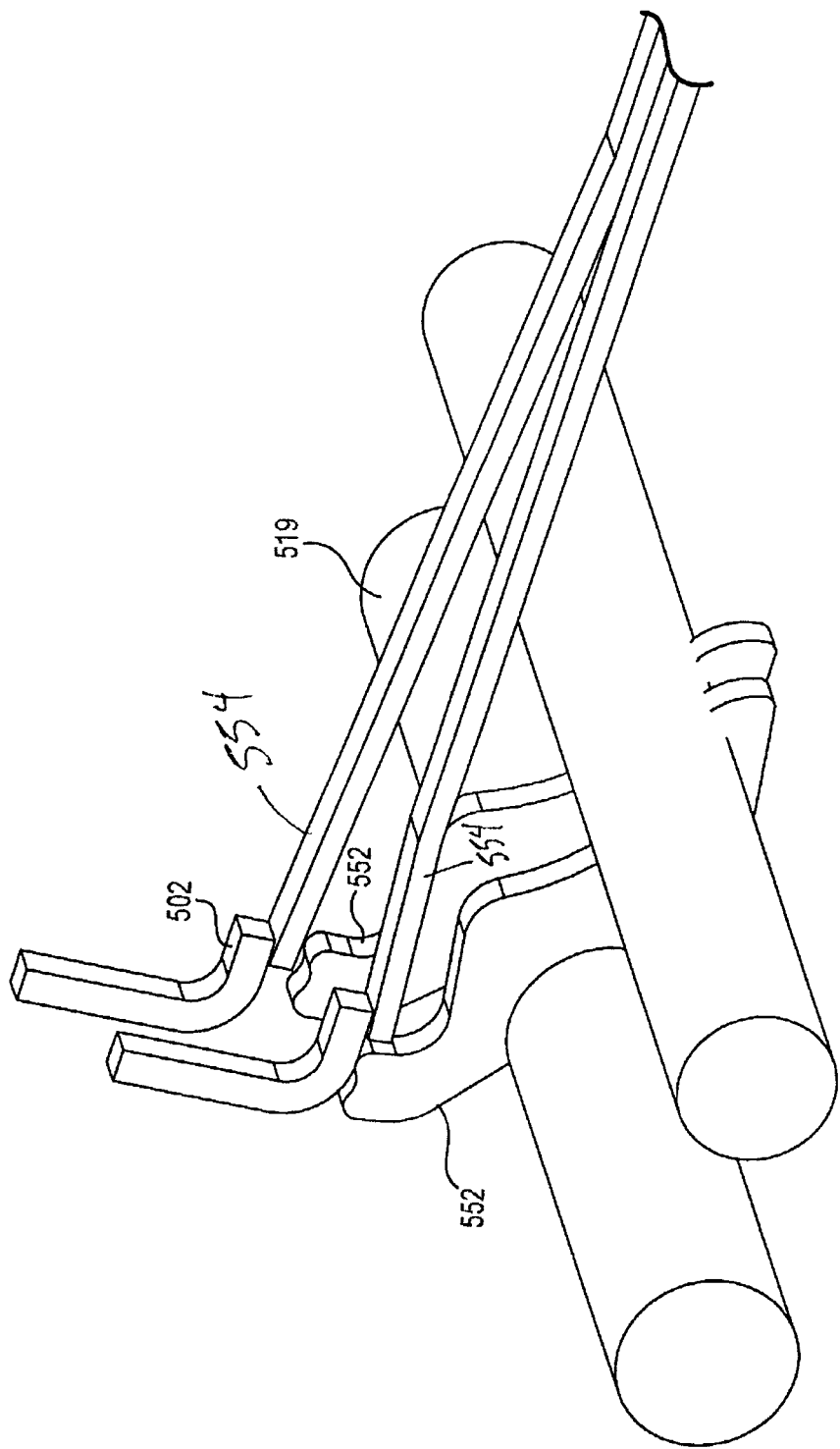
FIG. 33 is a perspective view similar to FIG. 29.

FIG. 33 provides clarity in the following ways. In this embodiment, the sense contact 554 is not forked. Further, the sense and force contacts are preferably collinear but preferably never come into contact with each other. It is possible for the two to contact each other briefly during insertion if so configured FIG. 33 shows the leaded contact 502 in two positions. The rearmost is where first contact is made. The sense contact 554 first encounters the lead 502 and as 554 is compressed by its own resilience or alternatively against the resilient element 519a, there will be a wiping action between the two. As shown in the foreground contacts, the sense contact 554 is compressed downwardly until it resides behind and adjacent the rocking force contact 552. It is apparent that they are collinearly aligned at all times. There is also a wiping action between contact 502 and 552 as 552 rocks in response to elastomer 519

The disclosure also inherently includes a method of constructing a device according to the disclosure. In addition there is a method of minimizing contact resistance when conducting temporary contact between a device under test and a test fixture having test contacts. Minimizing resistance is the goal of the wiping action described above. The test fixture has a force and sense fixture contact, to receive the test contact, and involves at least some or all of the following steps:
a. collinearly aligning the sense and force contact
b. resiliently locating the sense contact in a plane above the force contact but lateral thereto,
c. bring the test contact into physical contact with the sense contact
d. deflecting the sense contact by the test contact, causing the sense contact to wipe the test contact during deflection In addition the method may also include the following steps or parts thereof: allowing the force contact to be deflected when it encounters the test contact by configuring the force contact to have a rocking response to impingement.

The description of the invention and its applications as set forth herein is illustrative and is not intended to limit the scope of the invention. Variations and modifications of the embodiments disclosed herein are possible, and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

We claim:

1. A contact for use in a device for forming a plurality of temporary mechanical and electrical connections between a device under test having a plurality of terminals and a load board having a plurality of contact pads, each contact pad being laterally arranged to correspond to exactly one terminal, having a laterally oriented, housing longitudinally adjacent to the contact pads on the load board;
   a plurality of electrically conductive force contacts extending through longitudinal holes in the housing toward the device under test and being deflectable through the holes in the housing, each force contact in the plurality being laterally arranged to correspond to exactly one terminal; comprising:
   a plurality of electrically conductive sense contacts, each sense contact in the plurality being laterally arranged to correspond to exactly one force contact and exactly one terminal, each sense contact in the plurality extending toward the device under test proximate the corresponding force contact;
   wherein each sense contact in the plurality includes a fixed portion along the housing, a free portion extending hingedly away from the housing, and a hinged portion connecting the fixed portion and the free portion;
   wherein the hinged portion is laterally separated from the corresponding force contact; and
   wherein the free portion includes a portion at its distal end that extends adjacent to at least one side of a distal end of the corresponding force contact.

2. The contact of claim 1,
   wherein the free portion includes a pair of spaced apart contacts, defining a gap therebetween for receiving said force contact.

3. The contact of claim 1, wherein the sense contact in the plurality:
   is generally planar,
   includes an electrically insulating layer facing said gap so that force and sense contacts are insulated from each other.

4. The contact of claim 1,
   wherein each sense contact in the plurality is generally planar, and
   wherein each forked portion includes two parallel tines; and
   wherein each tine includes a lip directly adjacent to the corresponding force contact that extends out of the plane of the sense contact.

5. The contact of claim 1, wherein the forked portion includes tips at its distal end that extend laterally at least partially converging toward each other.

6. The contact of claim 1 wherein the sense contact includes a pair of contact, one located in front of the force contact and the other behind the sense contact.

7. The contact of claim 1 wherein said sense contact is positioned to make first contact with said device terminal when said device under test is applied thereto, and thereafter said force contact makes contact with said terminal.

8. The contact of claim 5 wherein the tips cross each other.

9. A method of minimizing contact resistance when conducting temporary contact between a device under test and a test fixture having test contacts, the test fixture have a force and sense fixture contact, to receive the test contact, the method comprising:
   a. collinearly aligning the sense and force contact
   b. resiliently locating the sense contact in a plane above the force contact but lateral thereto,
   c. bring the test contact into physical contact with the sense contact
   d. deflecting the sense contact by the test contact, causing the sense contact to wipe the test contact during deflection.

10. A device for forming a plurality of temporary mechanical and electrical connections between a device under test having a plurality of terminals and a load board having a plurality of contact pads, each contact pad being laterally arranged to correspond to exactly one terminal, comprising:
    a laterally oriented, electrically insulating housing longitudinally adjacent to the contact pads on the load board;
    a plurality of electrically conductive force contacts extending through longitudinal holes in the housing toward the device under test and being deflectable through the holes in the housing, the compressibility including a lateral translation of a lateral cross-section of each force contact, each force contact in the plurality being laterally arranged to correspond to exactly one terminal; and
    a plurality of electrically conductive sense contacts, each sense contact in the plurality being laterally arranged to correspond to exactly one force contact and exactly one terminal, each sense contact in the plurality laterally surrounding the corresponding force contact and being laterally slidable along the housing, the lateral sliding corresponding to the lateral translation of the lateral cross-section of the corresponding force contact.

11. The device of claim 10, wherein when the device under test is forced toward the housing, each terminal in the plurality simultaneously compresses the corresponding force contact through the corresponding hole in the housing and laterally slides the corresponding sense contact along the housing.

12. The device of claim 10, wherein each terminal in the plurality makes direct electrical and mechanical contact with a distal end of the corresponding force contact; and wherein each terminal in the plurality makes direct electrical and mechanical contact with an angled portion of the corresponding sense contact that extends toward the device under test.

13. The contact of claim 5, wherein each sense contact in the plurality:

is generally planar, includes an electrically conductive layer facing the device under test, and includes an electrically insulating layer facing away from the device under test.

14. The contact of claim 5 wherein each sense contact in the plurality includes an angled portion directly adjacent to the corresponding force contact that extends out of the plane of the sense contact.

15. The contact of claim 14, wherein the angled portion is deflectable toward the housing.

16. The contact of claim 14, wherein the angled portion is formed only from the electrically conductive layer.

17. The contact of claim 16, wherein along a dimension parallel to the sliding of the corresponding sense contact, the corresponding terminal on the device under test is larger than the corresponding force contact.

\* \* \* \* \*